(12) United States Patent
Takahara

(10) Patent No.: US 11,404,298 B2
(45) Date of Patent: Aug. 2, 2022

(54) TRAVELLING VEHICLE SYSTEM AND METHOD FOR CONTROLLING TRAVELLING VEHICLE

(71) Applicant: MURATA MACHINERY, LTD., Kyoto (JP)

(72) Inventor: Masayuki Takahara, Aichi (JP)

(73) Assignee: MURATA MACHINERY, LTD., Kyoto (JP)

( * ) Notice: Subject to any disclaimer, the term of this patent is extended or adjusted under 35 U.S.C. 154(b) by 478 days.

(21) Appl. No.: 16/374,770

(22) Filed: Apr. 4, 2019

(65) Prior Publication Data

US 2019/0318950 A1 Oct. 17, 2019

(30) Foreign Application Priority Data

Apr. 13, 2018 (JP) .............................. JP2018-077256

(51) Int. Cl.
| | |
|---|---|
| B61L 23/14 | (2006.01) |
| B61L 27/04 | (2006.01) |
| H01L 21/677 | (2006.01) |
| B65G 67/08 | (2006.01) |

(52) U.S. Cl.
CPC ........ *H01L 21/67724* (2013.01); *B61L 23/14* (2013.01); *B61L 27/04* (2013.01); *B65G 67/08* (2013.01); *H01L 21/6773* (2013.01); *H01L 21/67733* (2013.01); *B61L 2201/00* (2013.01); *B61L 2210/02* (2013.01)

(58) Field of Classification Search
CPC .... B61L 27/04; B61L 23/14; H01L 21/67724; G08G 1/22; G08G 1/00; G01C 21/34
See application file for complete search history.

(56) References Cited

U.S. PATENT DOCUMENTS

| | | | |
|---|---|---|---|
| 8,751,060 B2 * | 6/2014 | Kinoshita | G05D 1/0289 701/2 |
| 9,336,684 B2 * | 5/2016 | Harasaki | G05D 1/0297 |
| 2007/0016366 A1 | 1/2007 | Nagasawa | |

(Continued)

FOREIGN PATENT DOCUMENTS

| | | |
|---|---|---|
| JP | 2005-092823 A | 4/2005 |
| JP | 4135715 B2 | 8/2008 |
| WO | 2013/179802 A1 | 12/2013 |

*Primary Examiner* — Elaine Gort
*Assistant Examiner* — Tarek Elarabi
(74) *Attorney, Agent, or Firm* — Keating & Bennett, LLP

(57) ABSTRACT

A travelling vehicle system includes travelling vehicles and a controller. The controller includes a storage that stores a last permitted travelling vehicle, to which a passage permission is transmitted lastly and the passage permission for which is not canceled, for each direction in a branching section or a merging section included in a blocking area, stores a last canceled travelling vehicle, the passage permission for which is canceled lastly, for each direction in the blocking area, and stores the travelling vehicle, to which the passage permission in a same direction in the blocking area is transmitted lastly, as a forward travelling vehicle of a travelling vehicle waiting for the permission to pass through the blocking area at the time of transmission of the passage permission to the passage-permission waiting travelling vehicle, and a determiner that determines whether to give passage permission to the travelling vehicle waiting for the permission.

4 Claims, 14 Drawing Sheets

(56) References Cited

U.S. PATENT DOCUMENTS

2011/0106341 A1* 5/2011 Kinoshita ............ G07C 5/008
701/2
2015/0187218 A1 7/2015 Harasaki
2017/0229333 A1* 8/2017 Kinugawa ............ B61L 27/04

* cited by examiner

TRAVELLING VEHICLE SYSTEM AND METHOD FOR CONTROLLING TRAVELLING VEHICLE

CROSS REFERENCE TO RELATED APPLICATIONS

This application claims the benefit of priority to Japanese Patent Application No. 2018-077256 filed on Apr. 13, 2018. The entire contents of this application are hereby incorporated herein by reference.

BACKGROUND OF THE INVENTION

1. Field of the Invention

The present invention relates to a travelling vehicle system and a method for controlling the travelling vehicle.

2. Description of Related Art

In a semiconductor device manufacturing factory, and the like, a load containing, for example, semiconductor wafers or reticles is transported by a travelling vehicle system. The travelling vehicle system includes a plurality of travelling vehicles travelling on a track and a controller that controls a plurality of travelling vehicles. Each of the plurality of travelling vehicles transmits its own current position and the like to the controller by communication such as wireless communication. The controller decides a travelling vehicle that will be in charge of transporting a load based on positions of the travelling vehicles, and the like, and transmits a travelling command to the decided travelling vehicle.

In general, the track of the travelling vehicle system as described above has an intersection that is a branching section or a merging section (e.g., see International Publication No. 2009/142051 described below). In International Publication No. 2009/142051, a blocking area is provided in an area including an intersection. The controller controls a travelling vehicle entering the blocking area by control called blocking control. In this blocking control, the travelling vehicle transmits to the controller a request for the permission to pass through the blocking area when going to pass through the blocking area. In addition, the controller gives permission to pass through each blocking area to any one of the travelling vehicles having transmitted requests for permission to pass through the blocking area. The travelling vehicle enters the blocking area when obtaining passage permission from the controller, but stops in front of the blocking area when not being able to obtain passage permission.

In the blocking control as described above, the sequence of the travelling vehicles entering the blocking area is managed at all times, and for example, passage permission is given to each of the travelling vehicles in the sequence of entry into the blocking area. Thus, for example, a travelling route from a current position of each travelling vehicle to the blocking area has been obtained by calculation processing such as route searching, and based on the position of each travelling vehicle in the obtained travelling route, the sequence of the travelling vehicles entering the blocking area has been decided.

However, when the travelling route of each travelling vehicle is to be calculated by the calculation processing as described above, the calculation processing takes a relatively long time, and hence it takes a long time for the processing from the reception, by the controller, of the request from the travelling vehicle for the permission to pass through the blocking area to the completion of passage permission determination.

SUMMARY OF THE INVENTION

Preferred embodiments of the present invention achieve a shortened time required for processing from the reception of a request from a travelling vehicle for permission to pass through a blocking area to completion of a passage permission determination.

A travelling vehicle system according to a preferred embodiment of the present invention is a travelling vehicle system including a controller; and a plurality of travelling vehicles, each of which travels along a track partially including a blocking area including a branching section or a merging section, transmits a request for permission to pass through the blocking area to the controller, and passes through the blocking area when receiving passage permission from the controller, while stopping in front of the blocking area when receiving no passage permission, the controller canceling the passage permission for the travelling vehicle, to which the controller transmits the passage permission, after passage of the travelling vehicle through the blocking area. The controller includes a first storage that stores a last permitted travelling vehicle, to which the passage permission is transmitted lastly and the passage permission for which is not canceled, for each direction in the branching section or the merging section included in the blocking area, a second storage that stores a last canceled travelling vehicle, the passage permission for which is canceled lastly, for each direction in the branching section or the merging section included in the blocking area, a third storage that stores the travelling vehicle, to which the passage permission in the same direction in the blocking area is transmitted lastly, as a forward travelling vehicle of a travelling vehicle waiting for the permission to pass through the blocking area at the time of transmission of the passage permission to the passage-permission waiting travelling vehicle, and a determiner that determines whether to give passage permission to the travelling vehicle waiting for the permission to pass through the blocking area based on whether the forward travelling vehicle of the passage-permission waiting travelling vehicle coincides with the last permitted travelling vehicle or the last canceled travelling vehicle for the blocking area.

Further, when the last permitted travelling vehicle for the blocking area is stored in the first storage, if the last permitted travelling vehicle coincides with the forward travelling vehicle of the travelling vehicle waiting for the permission to pass through the blocking area and if a travelling direction of the passage-permission waiting travelling vehicle in the branching section or the merging section included in the blocking area is the same as a travelling direction of the last permitted travelling vehicle, the determiner may give permission to pass through the blocking area to the passage-permission waiting travelling vehicle.

Further, when the last permitted travelling vehicle for the blocking area including the branching section is not stored in the first storage, if the last canceled travelling vehicle for the blocking area coincides with the forward travelling vehicle of the travelling vehicle waiting for the permission to pass through the blocking area, the determiner may give permission to pass through the blocking area to the passage-permission waiting travelling vehicle.

Further, when the last permitted travelling vehicle for the blocking area including the merging section is not stored in the first storage, if the last canceled travelling vehicle coincides with the forward travelling vehicle of the passage-permission waiting travelling vehicle, the last canceled travelling vehicle having entered the merging section in the same direction as the passage-permission waiting travelling vehicle in the blocking area, the determiner may give permission to pass through the blocking area to the passage-permission waiting travelling vehicle.

A method for controlling a travelling vehicle according to a preferred embodiment of the present invention is a method for controlling a travelling vehicle in a travelling vehicle system including a controller, and a plurality of travelling vehicles, each of which travels along a track partially including a blocking area including a branching section or a merging section, transmits a request for permission to pass through the blocking area to the controller, and passes through the blocking area when receiving passage permission from the controller, while stopping in front of the blocking area when receiving no passage permission, the controller canceling the passage permission for the travelling vehicle, to which the controller transmits the passage permission, after passage of the travelling vehicle through the blocking area. The controller stores a last permitted travelling vehicle, to which the passage permission is transmitted lastly and the passage permission for which is not canceled, for each direction in the branching section or the merging section included in the blocking area, stores a last canceled travelling vehicle, the passage permission for which is canceled lastly, for each direction in the branching section or the merging section included in the blocking area, stores the travelling vehicle, to which the passage permission in the same direction in the blocking area is transmitted lastly, as a forward travelling vehicle of a travelling vehicle waiting for the permission to pass through the blocking area at the time of transmission of the passage permission to the passage-permission waiting travelling vehicle, and determines whether to give passage permission to the travelling vehicle waiting for the permission to pass through the blocking area based on whether the forward travelling vehicle of the passage-permission waiting travelling vehicle coincides with the last permitted travelling vehicle or the last canceled travelling vehicle for the blocking area.

Travelling vehicle systems and methods for controlling travelling vehicles according to preferred embodiments of the present invention do not need to use time-consuming processing such as searching for a travelling route of the travelling vehicle as described above, and the passage permission determination is able to be performed by simple processing such as reading the forward travelling vehicle of the travelling vehicle waiting for the permission to pass through the blocking area and the last permitted travelling vehicle or the last canceled travelling vehicle for the blocking area, and determining whether or not those travelling vehicles coincide with each other, so that it is possible to shorten the time required for the processing from the reception, by the controller, of a request from the travelling vehicle for permission to pass through the blocking area to the completion of the passage permission determination.

Further, in the mode where the determiner gives permission to pass through the blocking area to the passage-permission waiting travelling vehicle, when the last permitted travelling vehicle for the blocking area is stored in the first storage, if the last permitted travelling vehicle coincides with the forward travelling vehicle of the travelling vehicle waiting for the permission to pass through the blocking area and if a travelling direction of the passage-permission waiting travelling vehicle in the branching section or the merging section included in the blocking area is the same as a travelling direction of the last permitted travelling vehicle, in the blocking control of the branching section and the merging section, it is possible to achieve control of giving permission to pass through the blocking area to a plurality of travelling vehicles in duplication by simple processing, and as a result, it is possible to perform control so as to allow efficient passage of the plurality of travelling vehicles through the blocking area.

Further, in the mode where, when the last permitted travelling vehicle for the blocking area including the branching section is not stored in the first storage, the determiner gives permission to pass through the blocking area to the passage-permission waiting travelling vehicle if the last canceled travelling vehicle for the blocking area is the same as the forward travelling vehicle of the travelling vehicle waiting for the permission to pass through the blocking area, it is possible to achieve blocking control of the branching section by simple processing, and as a result, it is possible to shorten the time required for processing of the blocking control.

Further, in the mode where when the last permitted travelling vehicle for the blocking area including the merging section is not stored in the first storage, the determiner gives permission to pass through the blocking area to the passage-permission waiting travelling vehicle if the last canceled travelling vehicle having entered the merging section in the same direction as the passage-permission waiting travelling vehicle in the blocking area coincides with the forward travelling vehicle of the passage-permission waiting travelling vehicle, in the blocking control of the merging section, it is possible to achieve control of giving permission to pass through the blocking area to a plurality of travelling vehicles in duplication by simple processing, and as a result, it is possible to perform control so as to allow efficient passage of the plurality of travelling vehicles through the blocking area.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Figure 2:
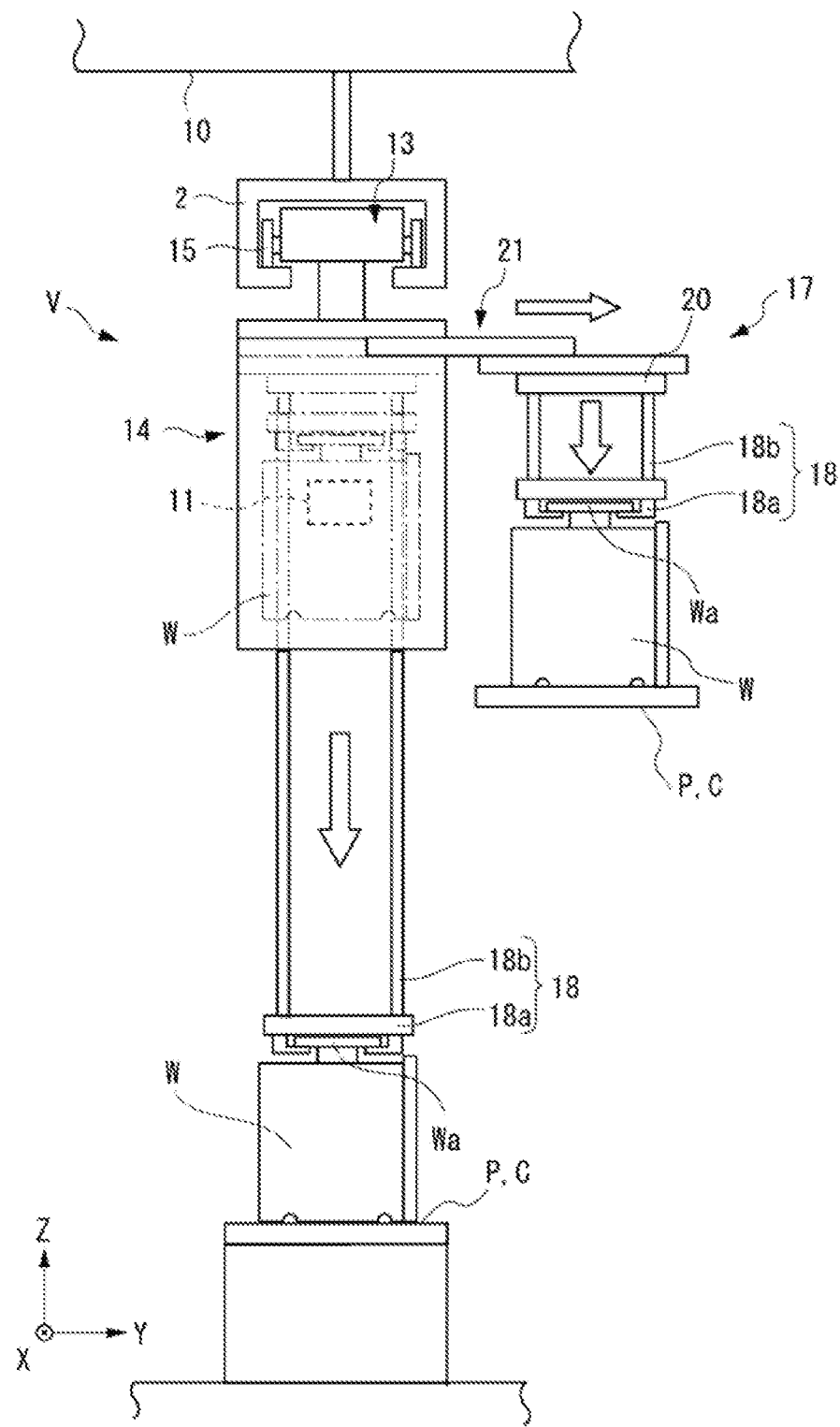
FIG. 2 is a diagram illustrating an example of a travelling vehicle.

Hereinafter, preferred embodiments of the present invention will be described with reference to the drawings. However, the present invention is not limited thereto. In the drawings, illustration is made, appropriately changing a scale size, such as partial enlargement or emphasis, so as to describe the preferred embodiments. In FIG. 2, the direction in the figure will be described using the XYZ coordinate system. In this XYZ coordinate system, the plane parallel to the horizontal plane is an XY plane. In this XY plane, a travelling direction of a travelling vehicle V is denoted as an X direction, and a direction orthogonal to the X direction is denoted as a Y direction. Further, a direction perpendicular to the XY plane is denoted as a Z direction. Each of the X direction, the Y direction, and the Z direction is described assuming that a direction of an arrow in the drawing is a +(plus) direction, and a direction opposite to the direction of the arrow is a −(minus) direction.

Figure 1:
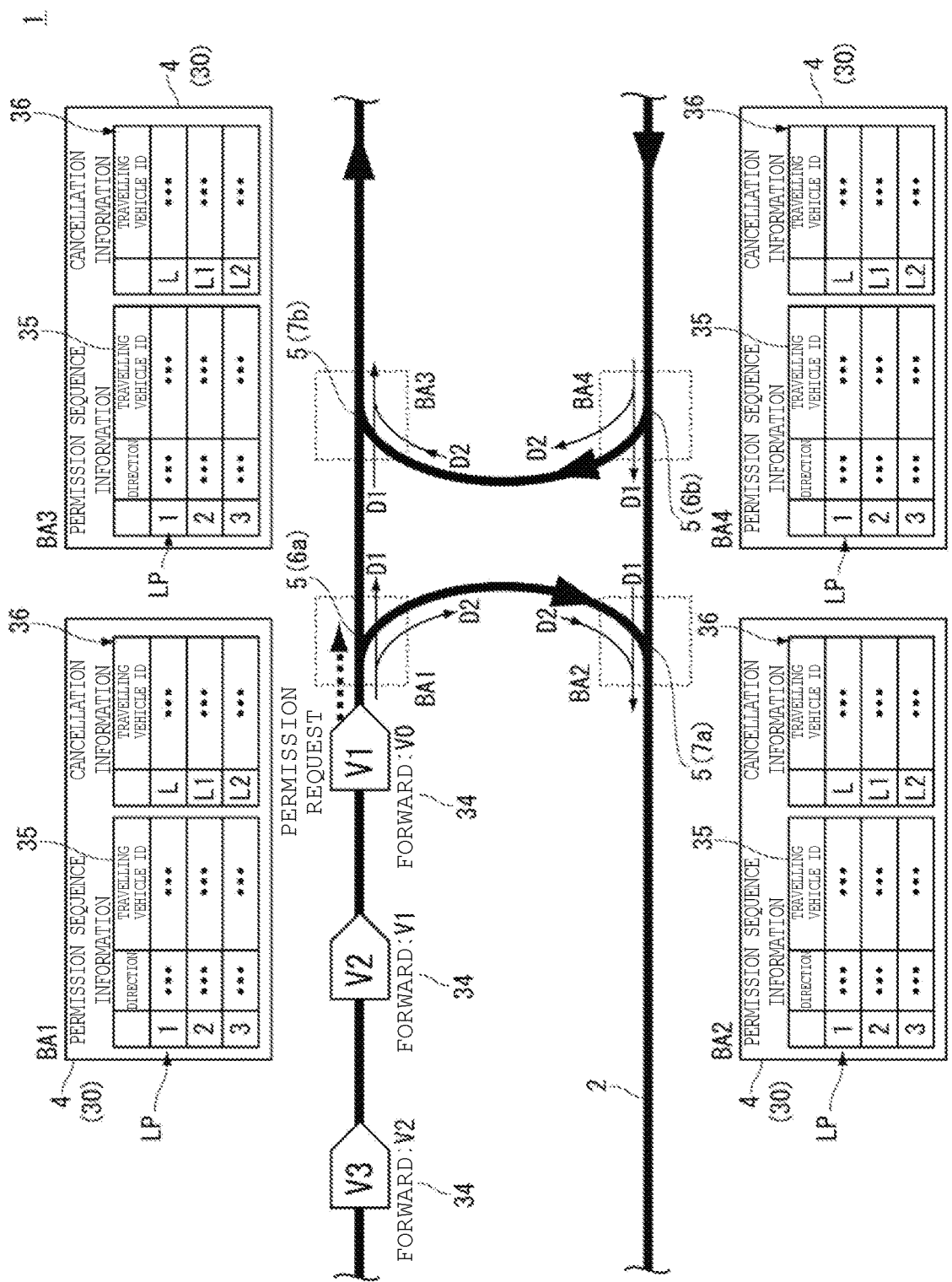
FIG. 1 is a view illustrating an example of a travelling vehicle system according to a preferred embodiment of the present invention.

FIG. 1 is a view illustrating a travelling vehicle system according to a first preferred embodiment of the present invention. In FIG. 1 and other figures, the symbol " . . . " in the figure indicates that predetermined information (including empty data) exists. The travelling vehicle system 1 includes a track 2, a plurality of travelling vehicles V1, V2, V3, . . . (hereinafter referred to as a travelling vehicle V in some cases) and a controller 4. The travelling vehicle system 1 is a transport system installed in a semiconductor device manufacturing factory, for example, and transports an article W (cf. FIG. 2) such as a front opening unified pod (FOUP) containing semiconductor wafers used for manufacturing semiconductor devices, or a reticle pod containing a processor such as a reticle.

Each of the plurality of travelling vehicles V travels along the track 2. The travelling vehicle V is an overhead travelling vehicle, for example, and the track 2 is a travelling rail provided on a ceiling of a clean room, or the like. Note that the travelling vehicle V may be a tracked vehicle travelling on the ground, and in this case, the track 2 is provided on a floor or the like.

The track 2 partially includes, as intersections 5, branching sections 6a, 6b (hereinafter referred to as a branching section 6 in some cases) and merging sections 7a, 7b (hereinafter referred to as a merging section 7 in some cases). Each of the branching sections 6a, 6b includes a branching point where one travelling rail branches into a plurality of (e.g., two) travelling rails. Each of the merging sections 7a, 7b includes a merging point where a plurality of (e.g., two) travelling rails merge into one travelling rail. Blocking areas BA1, BA4, BA2, BA3 (hereinafter referred to as a blocking area BA in some cases) are provided in the branching sections 6a, 6b and the merging sections 7a, 7b, respectively. In the travelling vehicle system 1, the number of the travelling vehicle V, the branching section 6, the merging section 7, and the blocking area BA can be set in a freely selectable manner.

The travelling vehicle system 1 controls the travelling vehicle V such that the travelling vehicles V pass through the blocking areas BA (BA1 to BA4) one by one. In the travelling vehicle system 1, when there is one travelling vehicle V in the blocking area BA, entry of other travelling vehicles V into the blocking area is prohibited. It is defined as a travelling rule of the travelling vehicle V that, for example, the travelling vehicle V travels only in a predetermined direction (or does not travel reversely) in the track 2. The above travelling rule is an example, and the travelling rule can be set arbitrarily.

The track 2 is provided adjacent to a processing device (not illustrated), a stocker (not illustrated), or the like. The above-mentioned processing device may be, for example, an exposure device, a coater/developer, a film forming device, or an etching device, and performs a variety of processing on semiconductor wafers in a container transported by the travelling vehicle V. The above-mentioned stocker (automated storage) stores the container transported by the travelling vehicle V.

FIG. 2 is a diagram illustrating an example of the travelling vehicle V. The travelling vehicle V travels in the +X direction along the track (the route) 2 suspended from a ceiling 10 of a building or the like, and is an overhead transport vehicle that grips the article W below and laterally (a direction including the Y direction) to a track TA at a load gripping point disposed below and laterally, and unloads the article W below and laterally (the direction including the Y direction) to the track TA at an unloading point disposed below and laterally. The travelling vehicle V includes an in-vehicle controller 11. The in-vehicle controller 11 controls the travelling vehicle V in accordance with a command transmitted from the controller 4 (or an area controller). The travelling vehicle V is controlled by the in-vehicle controller 11 and performs various operations.

The travelling vehicle V includes a travelling portion 13 and a body 14. The travelling portion 13 is provided with wheels 15 and travels along the track 2 by a travelling driver (not illustrated). The body 14 is provided in a state suspended below the travelling portion 13. The body 14 includes a transfer device 17. The transfer device 17 includes an article holder 18 that holds the article W, an elevation driver 20 that moves the article holder 18 up and down, and a sideways driver 21 that moves the elevation driver 20 laterally (+Y direction or −Y direction) to the track 2.

The article holder 18 is a chuck including a movable hook 18a, and enters the hook 18a below a flange Wa of the article W to suspend and hold the article W. The article holder 18 is connected to a suspension 18b such as a wire or a belt. The elevation driver 20 is, for example, a hoist, and raises and lowers the article holder 18 by feeding out or winding up the suspension 18b. The sideways driver 21 moves the article holder 18 and the elevation driver 20 from the position housed in the body 14 to the side of the track 2 by sliding a plurality of movable plates. The article W is gripped and unloaded by the travelling vehicle V by using the article holder 18 or the elevation driver 20 and the sideways driver 21. The article holder 18, the elevation driver 20, and the sideways driver 21 are controlled by the in-vehicle controller 11.

When the article W is to be gripped at a load gripping point P, the in-vehicle controller 11 instructs load gripping of the article W at the load gripping point P by stopping the travelling vehicle V at the load gripping point P, and operating the elevation driver 20, or the elevation driver 20 and the sideways driver 21, to move the article holder 18 to a predetermined position. The load gripping point P is, for example, a loading port of a processing device or a stocker, an overhead buffer or the like provided with a shelf, on which the article W can be placed, suspended from the ceiling 10 of the building or the like.

When the article W is to be unloaded at the unloading point C, the in-vehicle controller 11 instructs unloading of the article W at the unloading point C by stopping the travelling vehicle V at the unloading point C, and operating the elevation driver 20, or the elevation driver 20 and the sideways driver 21, to move the article holder 18 to a predetermined position. The unloading point C is, for example, a loading port of a processing device or a stocker, an overhead buffer or the like provided with a shelf, on which the article W can be placed, suspended from the ceiling 10 of the building or the like.

The travelling vehicle V includes a position sensor that detects a position marker provided on the track 2 to detect the current position of the travelling vehicle V; a loading sensor that detects the presence or absence of a load of the travelling vehicle V; and a front sensor that monitors the front of the travelling vehicle V in its travelling direction (Including the diagonally forward direction) to detect whether or not another travelling vehicle V exists in the front, and detects a distance between the travelling vehicle V and the other travelling vehicle V when the other travelling vehicle V exists in the front.

The in-vehicle controller 11 controls each element of the travelling vehicle V, and performs various kinds of data processing. The in-vehicle controller 11 performs control of travelling of the travelling vehicle V, setting of a travelling route of the travelling vehicle V, generation of state information of the travelling vehicle V, and the like. The in-vehicle controller 11 and the controller 4 (cf. FIG. 3) are wirelessly connected via a transmission path such as a wireless LAN, feeder communication using a feeder line, and the like. Further, the controller 4 is communicatively connected to the host controller (cf. FIG. 3) via a transmission path such as a wired LAN or a wireless LAN.

The travelling vehicle V is controlled by the host controller 28. The host controller 28 transmits a travelling command and the like to the travelling vehicle V via the controller 4. The travelling command is, for example, information indicating a departure place (a start point) and a destination (an end point) of the travelling vehicle V. The travelling vehicle V sets the travelling route based on the received travelling command (the departure place and the destination of the travelling vehicle V) and map information of the track 2 stored in advance in the storage.

The travelling vehicle V receives a state information request transmitted from the controller 4. The state information request is a command to request transmission of state information of the travelling vehicle V. The state information is information indicating the state of the travelling vehicle V. The state information includes, for example, a current position, a destination, a travelling state (a speed, etc.), a load state, a forward state, and a request for the permission to pass through the blocking area BA.

The travelling vehicle V transmits the request for the permission to pass through the blocking area BA to the controller 4 as the state information. When receiving the passage permission in response to the passage permission request from the controller 4, the travelling vehicle V passes through the blocking area BA, but when not receiving the passage permission, the travelling vehicle V stops in front of the blocking area BA, or travels while decelerating toward a stopped position (a standby position) set in front of the blocking area BA.

The request for the permission to pass through the blocking area BA includes identification information of the blocking area BA through which the travelling vehicle V requests passage, and directions (a direction D1 and a direction D2 illustrated in FIG. 1) in which the travelling vehicle V enters and passes through the blocking area BA. Based on the detection result of the position sensor and the map information of the travelling region, the travelling vehicle V detects that the travelling vehicle has approached the blocking area and generates a request for the permission to pass through the blocking area BA through which the travelling vehicle V is going to pass.

The state information is periodically updated by the in-vehicle controller 11, and information indicating the latest state is maintained. The controller 4 periodically transmits a status information request to the travelling vehicle V, and the travelling vehicle V transmits the latest state information to the controller as a response to the status information request from the controller 4. The state information described above is an example, and the state information may be in another mode.

Figure 3:
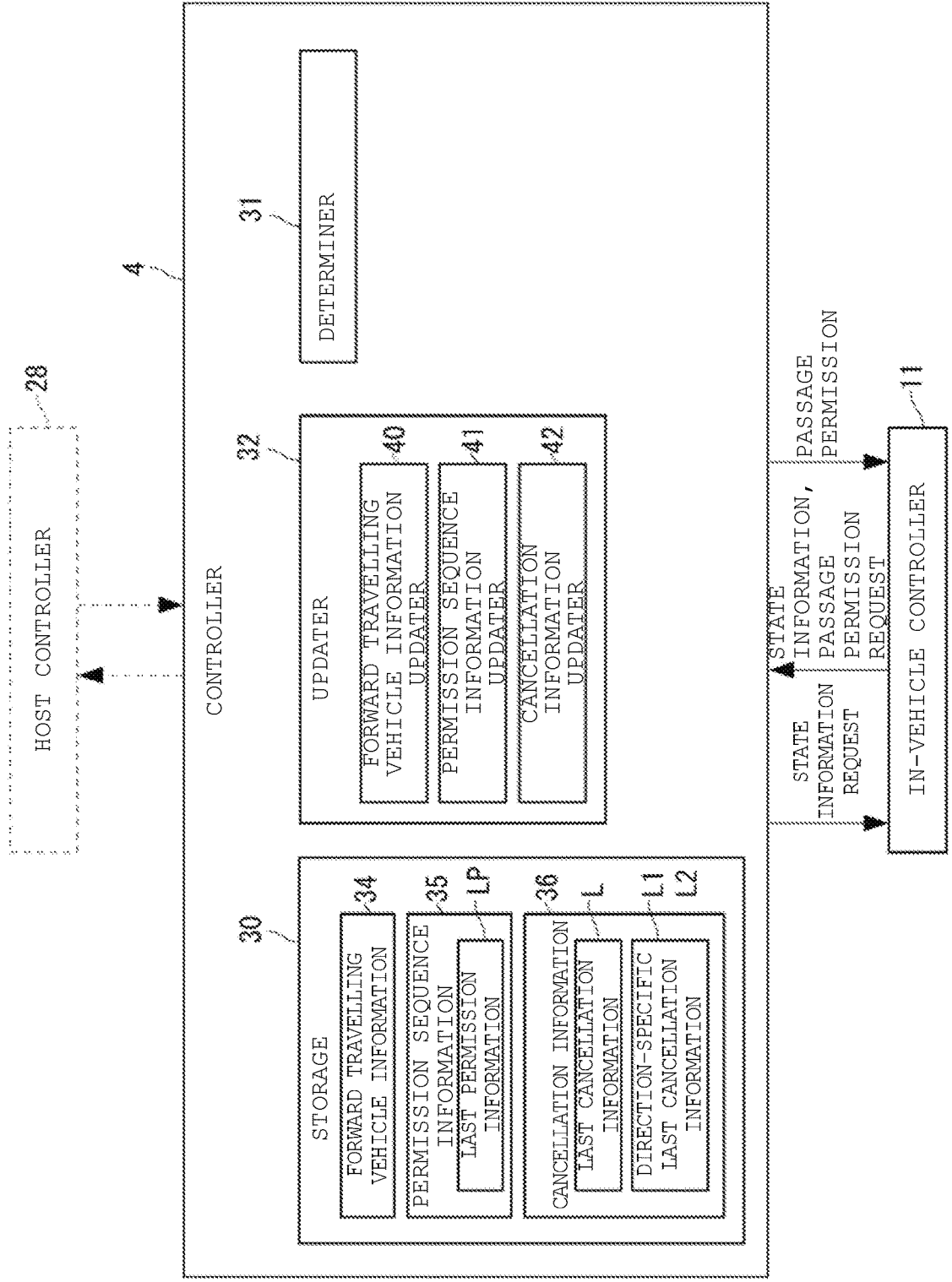
FIG. 3 is a diagram illustrating an example of a functional block configuration of a controller.

FIG. 3 is a diagram illustrating an example of the functional block configuration of the controller. The controller 4 is configured or programmed to control the travelling vehicle V. For example, the controller 4 performs blocking control to control whether or not to permit the travelling vehicle V to pass through (travel) the blocking area BA, the travelling vehicle V being scheduled to pass (scheduled to travel) through the blocking area BA. The controller 4 is configured or programmed to include a storage 30, a determiner 31, and an updater 32. The controller 4 is a computer device including, for example, a CPU, a main memory, a storage device, a communication device, and the like, and processes various pieces of information. The controller 4 processes various pieces of information (data), stores information, inputs and outputs information, and communicates (transmits and receives) information, for example. The configuration of the computer device used for the controller 4 is freely selectable and may be, for example, one device or a plurality of computer devices.

The storage 30 stores various pieces of information necessary for the operation of the controller 4. For example, the storage 30 includes a first storage that stores a last permitted travelling vehicle, to which passage permission has been transmitted lastly and the passage permission for which has not been canceled, for each direction (e.g., the direction D1, the direction D2) in a branching section 6 or a merging section 7 included in the blocking area BA, a second storage that stores a last canceled travelling vehicle having passage permission canceled lastly, for each direction in the branching section 6 or the merging section 7 included in the blocking area BA, and a third storage that stores the travelling vehicle V, to which the passage permission in the same direction in the blocking area BA has been transmitted lastly, as a forward travelling vehicle of the travelling vehicle waiting for the permission to pass through the blocking area BA at the time of transmission of the passage permission to the passage permission waiting travelling vehicle. For example, as an example of the travelling vehicle system 1 of the present preferred embodiment, a description will be given of an example of the configuration in which the storage 30 stores permission sequence information 35 including information of the last permitted travelling vehicle, stores cancellation information 36 including information of the last canceled travelling vehicle, and stores forward travelling vehicle information 34 including information of the forward travelling vehicle. The forward travelling vehicle information 34, the permission sequence information 35, and the cancellation information 36 are used for the blocking control.

The forward travelling vehicle information 34 is information on the forward travelling vehicle of the travelling vehicle V. The forward travelling vehicle is the travelling vehicle V travelling at a position closest to the front in the travelling direction of the travelling vehicle V. In other words, the forward travelling vehicle is a travelling vehicle travelling in the same travelling direction as the travelling vehicle V, and is a travelling vehicle travelling immediately before the travelling vehicle V. The forward travelling vehicle information 34 is used for determining permission of the passage permission request by the determiner 31. The forward travelling vehicle information 34 is set for each travelling vehicle V. For example, as illustrated in the example of FIG. 1, the forward travelling vehicle information 34 (indicated as "front:" in FIG. 1 and other figures) is set with respect to each travelling vehicle V such that the forward travelling vehicle of the travelling vehicle V1 is a travelling vehicle V0 (not illustrated), the forward travelling vehicle of the travelling vehicle V2 is the travelling vehicle V1, the forward travelling vehicle of the travelling vehicle V3 is the travelling vehicle V2. The controller 4 manages the forward travelling vehicle information 34 of each travelling vehicle V. The forward travelling vehicle information 34 is, for example, information (e.g., table data) in which, an identification number of each travelling vehicle V and an identification number of the forward travelling vehicle are associated with each other. The forward travelling vehicle information 34 is stored in the third storage and is updated with a predetermined condition by a forward travelling vehicle information updater 40 which will be described later. When the forward travelling vehicle information 34 as described above is to be used, it is possible to obtain the arrangement sequence of each travelling vehicle V. For example, it is possible to obtain the arrangement sequence of the travelling vehicles V from the information of each travelling vehicle V and the forward travelling vehicle information 34 of each travelling vehicle V. In the travelling vehicle system 1, as described later, by using the forward travelling vehicle information 34, without using a complicated and time-consuming method such as route searching, by a simple method, the arrangement sequence of the travelling vehicles V and the blocking control is able to be performed. When the forward travelling vehicle information 34 is not set as in the installation stage or just after the installation of the travelling vehicle system 1, for example, a plurality of travelling vehicles V are experimentally traveled to acquire information such as the arrangement sequence of the travelling vehicles V or the passage sequence of the travelling vehicles V in a predetermined position (e.g., the blocking area BA), and the forward travelling vehicle information 34 may be set based on the acquired information. Note that the setting of the forward travelling vehicle information 34 described above may be set by the controller 4, or may be set by inputting into the controller 4 the forward travelling vehicle information 34 set by a computer other than the controller 4, or a human.

The permission sequence information 35 is information on the sequence of the travelling vehicles V, to which the controller 4 has transmitted passage permission, in each blocking area BA. The permission sequence information 35 includes last permission information LP on the last permitted travelling vehicle, to which the passage permission has been transmitted lastly and the passage permission for which has not been canceled, for each direction in the branching section 6 or the merging section 7 included in the blocking area BA. The permission sequence information 35 is managed for each of the blocking areas BA1 to BA4 by the controller 4. For example, the permission sequence information 35 is information in which information (1, 2, 3 . . . in FIG. 1) indicating the sequence of passage permission, information indicating a direction in which the travelling vehicle V enters and passes through the blocking area BA, and the identification information of the travelling vehicle V are associated with each other. In the example of the permission sequence information 35 illustrated in the present preferred embodiment, it is assumed that, the smaller the value indicating the sequence of the travelling vehicle V to which the passage permission has been given, the newer the information is.

The controller 4 cancels the passage permission after the travelling vehicle V, to which the passage permission has been given, passes through the blocking area BA. When the permission to pass through the blocking area BA, given to the travelling vehicle V, is canceled, the information on the travelling vehicle V from which the passage permission has been canceled is deleted from the permission sequence information 35. That is, the information registered in the permission sequence information 35 is information on the travelling vehicle V to which the passage permission has been given and the passage permission for which has not been canceled. In addition, when the permission to pass through the blocking area BA, given to the travelling vehicle V, is canceled, the controller 4 registers (stores) information on the travelling vehicle V, the passage permission for which has been canceled, into the cancellation information 36. That is, the permission sequence information 35 and the cancellation information 36 are controlled by the controller 4 such that the same travelling vehicle V is not stored in duplication into both the permission sequence information 35 and the cancellation information 36. The permission sequence information 35 is, for example, information in which information (e.g., 1, 2, . . . ) indicating the sequence of passage permission, direction information indicating a direction in which the travelling vehicle V enters and passes through the blocking area BA, and identification information of the travelling vehicle V are associated with each other. In the present preferred embodiment, the direction in which the travelling vehicle V enters and passes through the blocking area BA is denoted by symbol "D1" in the straight direction and by symbol "D2" in the curve direction (the direction including a curve). Further, in the present preferred embodiment, it is assumed that, the smaller the value indicating the sequence of passage permission indicated by the information, the newer the information is. That is, in the present preferred embodiment, the last permitted travelling vehicle is stored into the first storage as the last permission information LP in a sequence 1 of the permission sequence information 35. The presence or absence of the last permitted travelling vehicle in each blocking area BA can be determined based on the presence or absence of information on the travelling vehicle V stored in the first storage.

The permission sequence information 35 is stored into the storage 30 such as the first storage and is updated at predetermined timing by a permission sequence information updater 41 to be described later. The permission sequence information 35 is not limited to the example illustrated in FIG. 1 and other figures. For example, the permission sequence information 35 may be only the last permission information LP, or may be information of the time when the passage permission is given as the information indicating the sequence of passage permission.

The cancellation information 36 is information on the travelling vehicle V having passed through the blocking area BA. The cancellation information 36 includes last cancellation information L on the last canceled travelling vehicle, which lastly passed through the blocking area BA and the passage permission for which has been canceled, and direction-specific last cancellation information L1, L2 on direction-specific last canceled travelling vehicles, which lastly passed in the branching section 6 and the merging section 7 and the passage permission for which has been canceled. The direction-specific last cancellation information L1 is information (e.g., identification information of the travelling vehicle) indicating the last travelling vehicle V that entered and passed through the blocking area BA in the direction D1 (the straight direction). The direction-specific last cancellation information L2 is information (e.g., identification information of the travelling vehicle) indicating the last travelling vehicle V that entered and passed through the blocking area BA in the direction D2 (the curve direction). The cancellation information 36 is managed for each of the blocking areas BA1 to BA4. The cancellation information 36 is updated by a cancellation information updater 42 which will be described later.

The determiner 31 determines whether or not to give the passage permission in response to the passage permission request from each travelling vehicle V in each blocking area BA (hereinafter referred to as "passage permission determination" in some cases). The determiner 31 determines whether or not to give the passage permission to the passage-permission waiting travelling vehicle based on the forward travelling vehicle of the travelling vehicle waiting for the permission to pass through the blocking area BA coincides with the last permitted travelling vehicle or the last canceled travelling vehicle for the blocking area BA. The "travelling vehicle waiting for the permission to pass (passage-permission waiting travelling vehicle)" is a travelling vehicle which transmits passage permission to the controller 4 and is waiting for a result of the passage permission determination from the controller 4. When the passage permission request is received from the travelling vehicle V, the determiner reads the forward travelling vehicle information 34 of the travelling vehicle V and any of the last permission information LP, the last cancellation information L, and the direction-specific last cancellation information L1, L2 for the blocking area BA through which the travelling vehicle V is going to pass, from the storage 30 (the first storage, the second storage, the third storage), and the determiner 31 determines whether or not to give the passage permission to the travelling vehicle V based on whether or not the forward travelling vehicle of the travelling vehicle V coincides with any of the last permitted travelling vehicle, the last canceled travelling vehicle, and the direction-specific last canceled travelling vehicle in the blocking area BA. The determiner 31 will be further described in the following description.

The updater 32 includes a forward travelling vehicle information updater 40 that updates (sets) the forward travelling vehicle information 34, a permission sequence information updater 41 that updates (sets) the permission sequence information 35 (LP), and a cancellation information updater 42 that updates (sets) the cancellation information 36 (L, L1, L2). The updater 32 will be further described in the following description.

The operation related to the blocking control in the travelling vehicle system 1 of the present preferred embodiment (the method for controlling the travelling vehicle according to the present preferred embodiment) will be described. In the travelling vehicle system 1, the blocking control is performed by grasping the arrangement sequence of a plurality of travelling vehicles V based on the rule that the arrangement sequence of a plurality of travelling vehicles V does not change between the two blocking areas BA, the forward travelling vehicle information 34, and the last permission information LP, the last cancellation information L, and the direction-specific last cancellation information L1, L2 for the blocking area BA through which the travelling vehicle V is going to pass.

When the branching section 6 and the merging section 7 are present, the arrangement sequence of the travelling vehicles V is different depending on whether or not the branching section 6 or the merging section 7 is a subject section. In the travelling vehicle system 1, the blocking control in the blocking area BA of the branching section 6 (hereinafter referred to as "the blocking control of the branching section 6" in some cases) and the blocking control in the blocking area BA of the merging section 7 (hereinafter referred to as "the blocking control of the merging section 7" in some cases) are performed in different manners.

Figure 4:
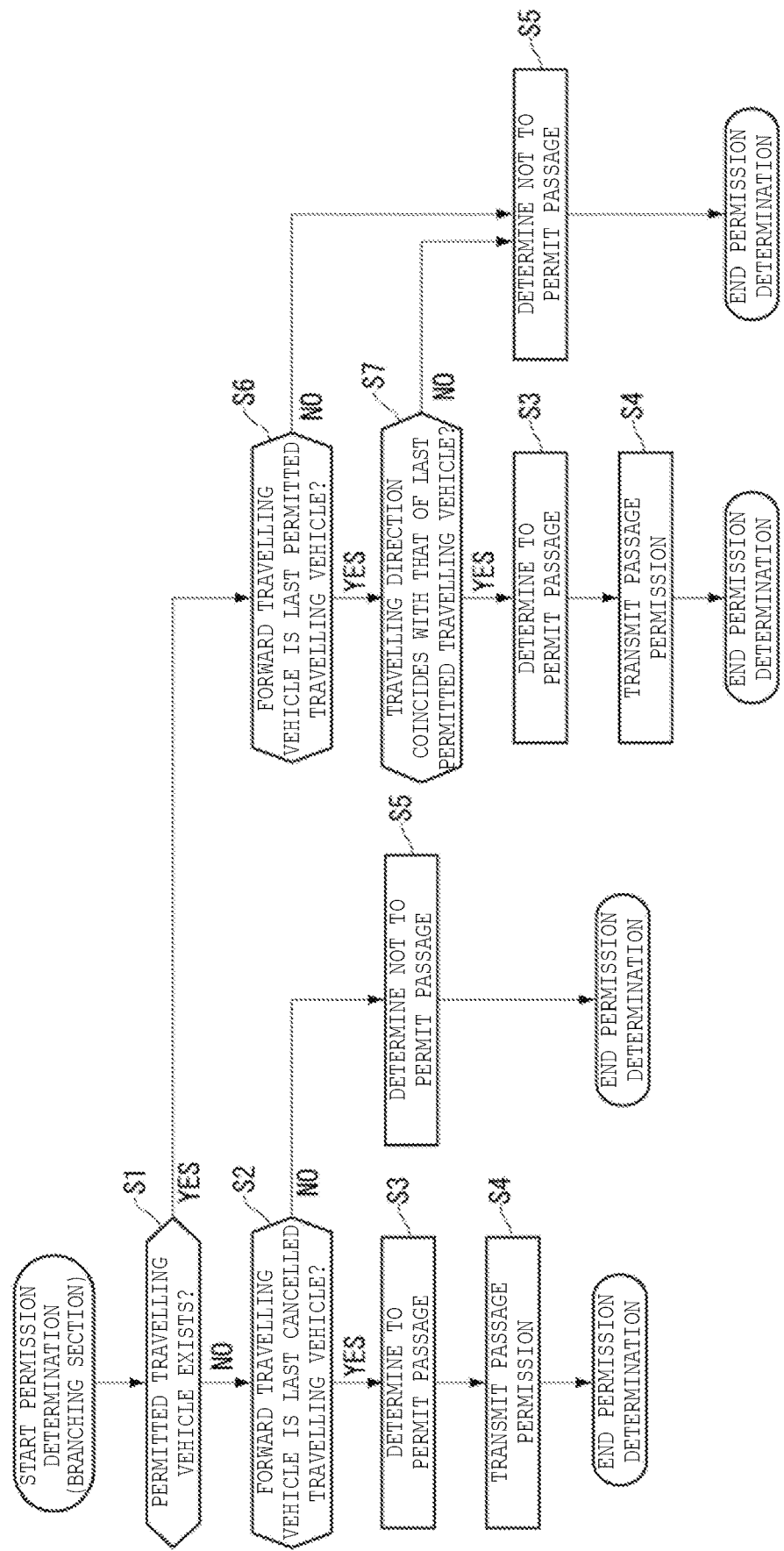
FIG. 4 is a flowchart illustrating the operation of determination on a request for a permission to pass through a blocking area of a branching section.

In the following description, first, the blocking control of the branching section 6 in the travelling vehicle system 1 will be described, and then the blocking control of the merging section 7 will be described. FIG. 4 is a flowchart illustrating the operation of determination on the request for the permission to pass through the blocking area BA of the branching section 6. FIGS. 5 to 8 are diagrams for explaining the operation of the blocking control of the branching section 6 in the travelling vehicle system 1.

Figure 5:
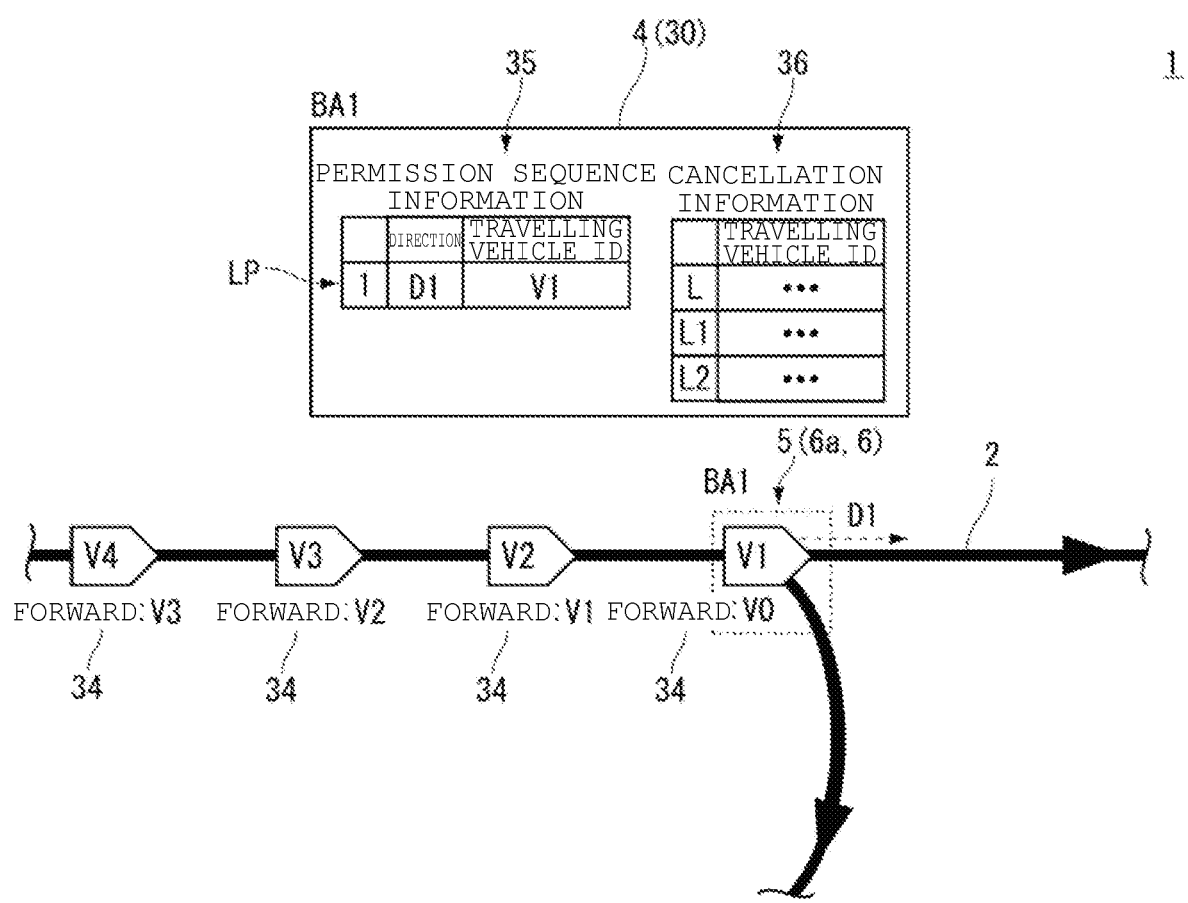
FIG. 5 is a diagram for explaining blocking control of a branching section.
Figure 6:
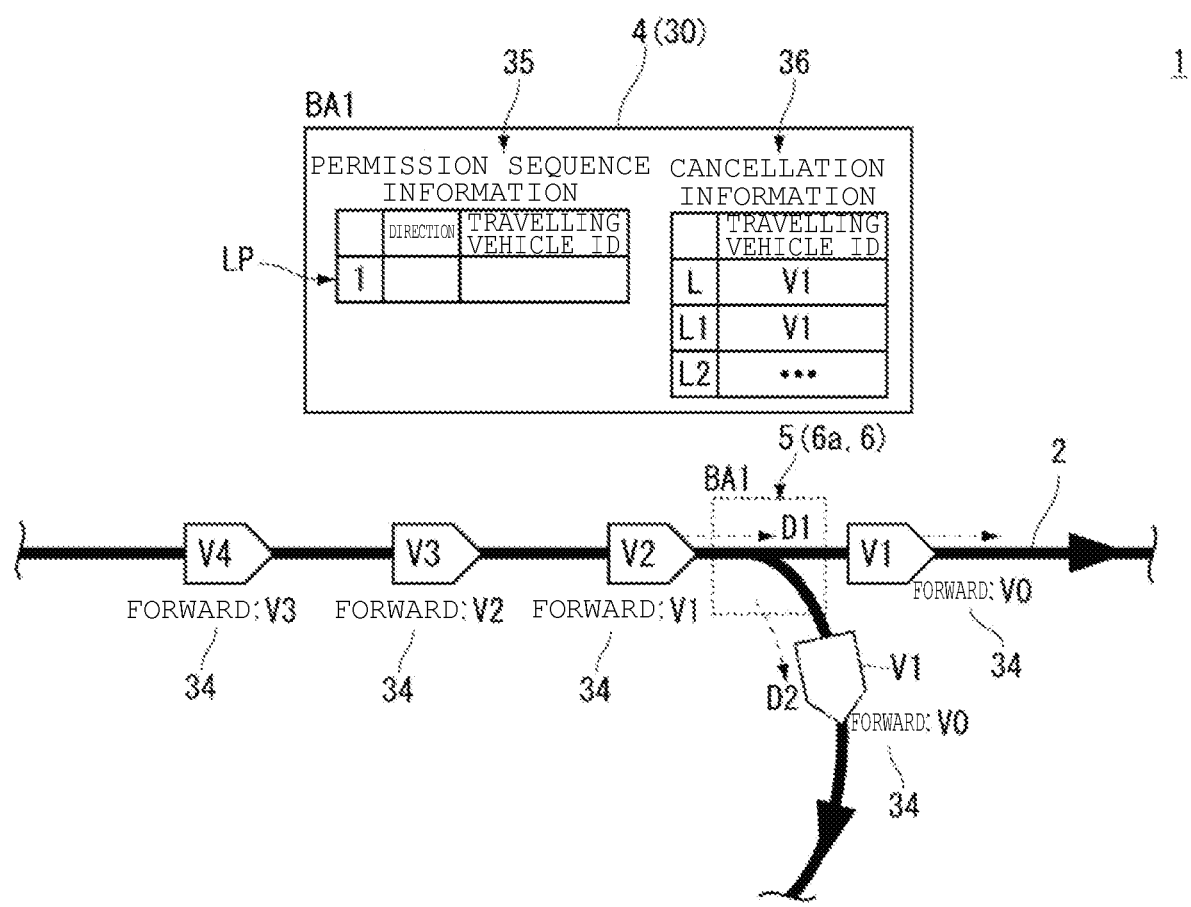
FIG. 6 is a diagram for explaining the blocking control of the branching section, following FIG. 5.

Here, the state of the travelling vehicle system 1 of the example illustrated in FIGS. 5 and 6 will be described. The travelling vehicle V1 of FIG. 5 is in a state where the passage permission to enter and pass through the blocking area BA1 in the direction D1 has been obtained from the controller 4. It is assumed that the travelling vehicles V2, V3, V4 are travelling in this sequence behind the travelling vehicle V1 of FIG. 5. The travelling vehicles V0 (not illustrated), V1, V2, V3 are respectively registered in the forward travelling vehicle information 34 of the travelling vehicles V1, V2, V3, V4. In the permission sequence information 35, the travelling vehicle V1 to which permission to pass through the blocking area BA1 has been given is registered in the sequence 1. That is, in the permission sequence information 35, the travelling vehicle V1 is registered as the last permitted travelling vehicle. It is assumed that the state of the travelling vehicle system 1 changes from the state illustrated in FIG. 5 to the state illustrated in FIG. 6. In FIG. 6, it is assumed that the travelling vehicle V1 is in the state having passed through the blocking area BA1. In FIG. 6, it is assumed that at the timing when the travelling vehicle V1 passes through the blocking area BA1, the permission to pass through the blocking area BA1 is canceled, the permission sequence information 35 on the travelling vehicle V1 for which the passage permission has been canceled is deleted, and the travelling vehicle V1 is registered as the last canceled travelling vehicle and the direction-specific last canceled travelling vehicle (L1) in the cancellation information 36.

In the travelling vehicle system 1 of the present preferred embodiment, as a fundamental principle of the blocking control of the branching section 6, the controller 4 gives the passage permission in the sequence of the travelling vehicle V arriving at the blocking area BA. For example, in the case of the example illustrated in FIG. 5, the controller 4 gives the permission to pass through the blocking area BA1 in the sequence of the travelling vehicles V1, V2, V3, V4.

Further, in the travelling vehicle system 1 of the present preferred embodiment, as the principle of the blocking control of the branching section 6, while the permission to pass through the blocking area BA has been given to a certain travelling vehicle V by the controller 4 (until the permission of the travelling vehicle V to pass through the blocking area BA is canceled), the permission to pass through the blocking area BA is not given to a travelling vehicle V other than the travelling vehicle V to which the passage permission has been given. For example, in the case of the example illustrated in FIG. 5, the controller 4 does not give the travelling vehicles V2, V3, V4 the permission to pass through the blocking area BA1 while the travelling vehicle V1 has been given the permission to pass through the blocking area BA1. In the travelling vehicle system 1, as a principle, the passage permission is given to only one travelling vehicle V1 in one blocking area BA1 to prevent a plurality of travelling vehicles V from entering the blocking area BA1.

Further, in the travelling vehicle system 1 of the present preferred embodiment, as an exception to the fundamental principle and the principle of the blocking control of the branching section 6, while the permission to pass through the blocking area BA1 has been given to the travelling vehicle V1, even before cancellation of the passage permission, the controller 4 gives the permission to pass through the blocking area BA1 to the travelling vehicle V2 travelling immediately after the travelling vehicle V1 to which the passage permission has been given, when the travelling vehicle V2 enters and passes through the blocking area BA1 in the same direction as the travelling vehicle V1 to which the passage permission has been given. In this case, the permission to pass through the blocking area BA1 comes into a state where the permission to pass through the blocking area BA1 has been given to the travelling vehicles V1, V2 in duplication (continuous permission). Hence, the travelling vehicle system 1 is able to perform control so as to allow the plurality of travelling vehicles V1, V2 to efficiently pass through the blocking area BA1. The continuous permission will be described further below.

An example of the operation related to the fundamental principle, the principle, and the exceptions in the blocking control of the branching section 6 of the travelling vehicle system 1 will be described based on the flowchart of FIG. 4 with reference to FIGS. 5 to 8.

In Step S1 of FIG. 4, when the controller 4 receives the request for the permission to pass through the blocking area BA of the branching section 6 from the travelling vehicle V, the determiner 31 determines whether or not the travelling vehicle V, which has obtained the passage permission, and the passage permission of which has not been canceled (the passage permission not yet canceled), exists in the blocking area BA. In other words, the determiner 31 determines whether or not the travelling vehicle V exists which has obtained the permission to pass through the blocking area BA and has not passed through the blocking area BA (hereinafter referred to as "permitted to pass" or "passing" in some cases). The determiner 31 performs the above determination based on the permission sequence information 35. The determiner 31 determines whether or not the last permitted travelling vehicle is stored into the last permission information LP stored in the first storage and performs the above determination. For example, in the example of FIG. 6, when the controller 4 receives the request for the permission to pass through the blocking area BA1 from the travelling vehicle V2, the determiner 31 determines, based on the permission sequence information 35, that there is no last permitted travelling vehicle stored in the first storage and determines that the travelling vehicle V permitted to pass does not exist in the blocking area BA1 (NO in Step S1).

When the determiner 31 determines in Step S1 that the travelling vehicle V permitted to pass does not exist in the blocking area BA (NO in Step S1), in Step S2, the determiner 31 determines whether or not the forward travelling vehicle of the travelling vehicle V having transmitted the passage permission request coincides with the travelling vehicle V that lastly passed through the blocking area BA (the last canceled travelling vehicle). The determiner 31 determines whether or not to give the passage permission to the passage-permission waiting travelling vehicle, depending on whether or not the forward travelling vehicle of the travelling vehicle waiting for the permission to pass through the blocking area BA and the last canceled travelling vehicle for the blocking area BA coincide with each other.

For example, in the example of FIG. 6, based on the forward travelling vehicle information 34 and the last cancellation information L, the determiner 31 determines that the forward travelling vehicle (the travelling vehicle V1) of the travelling vehicle V2 having transmitted the passage permission request coincides with the last canceled travelling vehicle (the travelling vehicle V1) (YES in Step S2). As illustrated in FIG. 6, also when the travelling vehicle V1 (indicated by a two-dot chain line in FIG. 6) enters and passes through the blocking area BA1 in the direction D2, the determiner 31 determines that the forward travelling vehicle (the travelling vehicle V1) of the travelling vehicle V2 having transmitted the passage permission request coincides with the last canceled travelling vehicle (the travelling vehicle V1) (YES in Step S2). By this determination (YES in Step S2), a state is determined where no other travelling vehicle V exists between the travelling vehicle V2 and the travelling vehicle V1, and the travelling vehicle V2 is travelling continuously to the travelling vehicle V1, and the arrangement sequence of the travelling vehicle V1 and the travelling vehicle V2 is obtained.

When the determiner 31 determines in Step S2 that the forward travelling vehicle coincides with the last canceled travelling vehicle (YES in Step S2), the determiner 31 determines to permit (give the passage permission in response to) the received passage permission request (Step S3) and transmits the passage permission to the target travelling vehicle V (Step S4), and the passage permission determination is terminated. For example, in the example of FIG. 6, the determiner 31 determines to permit the request for the permission to pass through the blocking area BA1 by the travelling vehicle V2, transmits the passage permission to the travelling vehicle V2, and the passage permission determination is terminated.

Subsequently, the permission sequence information updater 41 updates the permission sequence information 35 at the timing of transmission of the passage permission by the determiner 31. The permission sequence information updater 41 updates the permission sequence information 35 (the last permission information LP) (not illustrated) with the travelling vehicle V2, to which the passage permission has been given, taken as a sequence (the last permitted travelling vehicle).

When the determiner 31 determines in Step S2 that the forward travelling vehicle concerning the travelling vehicle V having transmitted the passage permission request does not coincide with the last canceled travelling vehicle (NO in Step S2), the determiner 31 determines not to permit the target passage permission request (Step S5), and the passage permission determination is terminated.

As described above, in the travelling vehicle system 1 of the present preferred embodiment, when the blocking area BA has the branching section 6, and when there is no travelling vehicle V passing through the blocking area BA, if the forward travelling vehicle of the travelling vehicle V having transmitted the request for the permission to pass through the blocking area BA coincides with the last canceled travelling vehicle for the blocking area, the determiner 31 gives the passage permission to the travelling vehicle V. In the travelling vehicle system 1 of the present preferred embodiment, when the last permitted travelling vehicle for the blocking area BA including the branching section 6 is not stored in the first storage, if the last canceled travelling vehicle for the blocking area BA coincides with the forward travelling vehicle of the travelling vehicle waiting for the permission to pass through the blocking area, the permission to pass through the blocking area BA is given to the passage-permission waiting travelling vehicle. When the determiner 31 determines to permit the passage permission request under the above conditions, the travelling vehicle V permitted to pass through the blocking area BA does not exist, and the forward travelling vehicle and the last canceled travelling vehicle coincide with each other, so that it is possible to control the travelling vehicle V such that other travelling vehicles V not permitted to pass through the blocking area BA does not exist between the travelling vehicle V having transmitted the passage permission request and the last canceled travelling vehicle. As a result, the travelling vehicle system 1 is able to control the travelling vehicle V in accordance with the above-described fundamental principle of the blocking control of the branching section 6. As described above, according to the configuration of the travelling vehicle system 1, the blocking control of the branching section 6 is able to be achieved by simple processing, and the time required for processing of the blocking control is able to be shortened.

Further, in the travelling vehicle system 1 of the present preferred embodiment, control related to the continuous permission is performed.

When the determiner 31 determines in Step S1 of FIG. 4 that the travelling vehicle V permitted to pass exists in the blocking area BA (YES in Step S1), in Step S6, the determiner 31 determines, based on the permission sequence information 35, whether or not the forward travelling vehicle of the travelling vehicle V having transmitted the passage permission request is the same as the last permitted travelling vehicle. The determiner 31 performs the above determination based on the last permission information LP stored in the first storage.

Figure 7A:
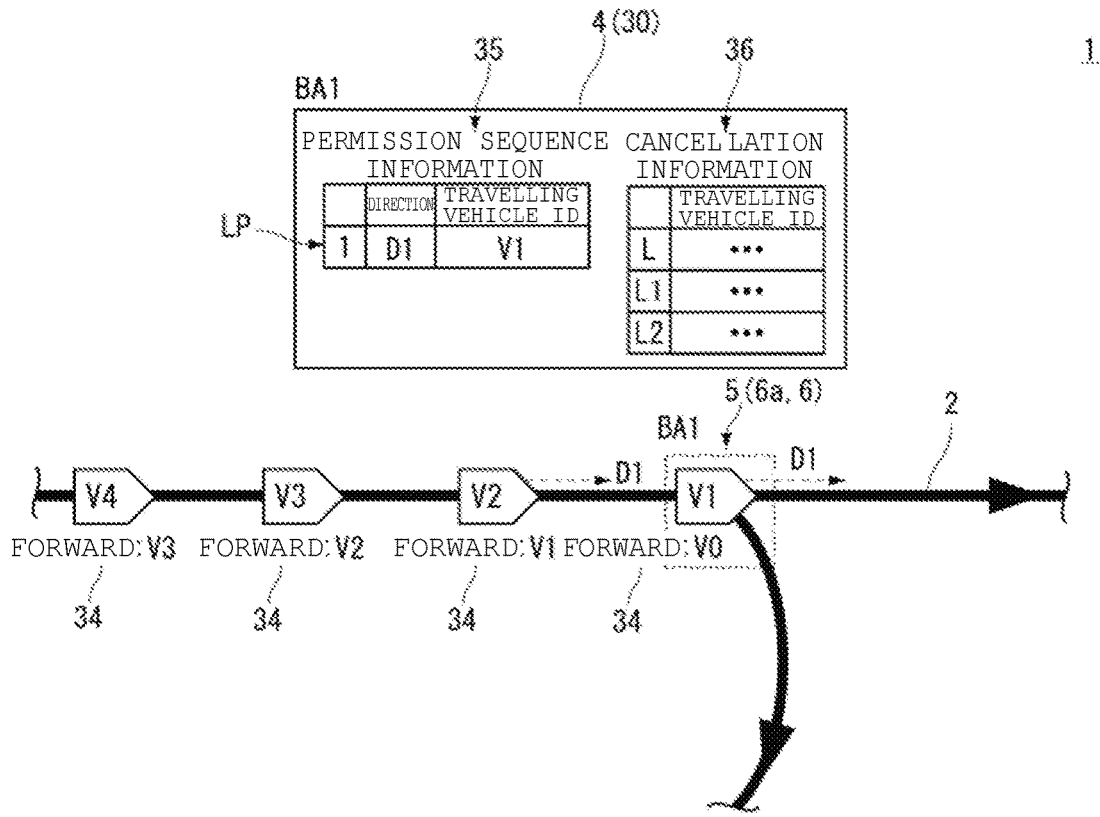
FIGS. 7A and 7B are diagrams for explaining the blocking control of the branching section, following FIG. 6.

Here, in the example illustrated in FIG. 7A, when the travelling vehicle V1 obtains the passage permission to enter and pass through the blocking area BA1 in the direction D1 and is not passing through the blocking area BA1 (the travelling vehicle V1 is in the state permitted to pass), it is assumed to be a state in which the travelling vehicle V2 has transmitted to the controller 4 the passage permission request to enter and pass through the blocking area BA1 in the direction D1.

Figure 7B:
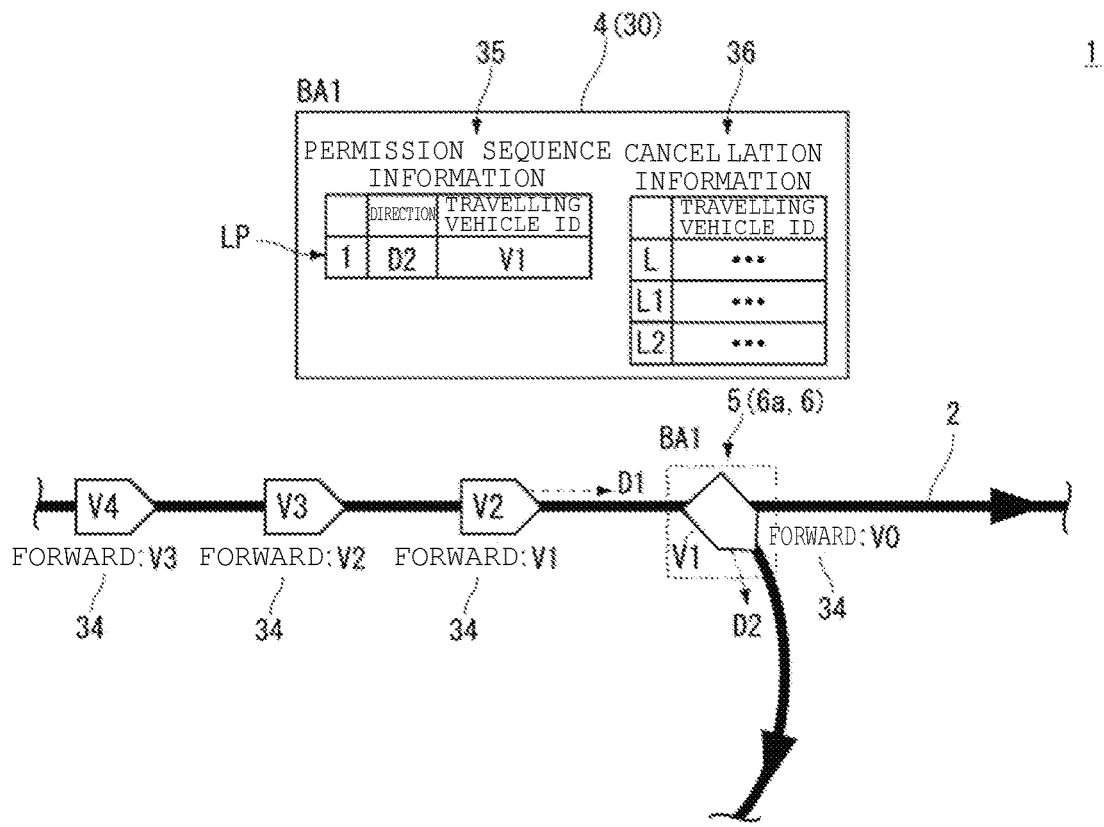

In the example illustrated in FIG. 7B, when the travelling vehicle V1 obtains the passage permission to enter and pass through the blocking area BA1 in the direction D2 and the travelling vehicle V1 is not passing through the blocking area BA1 (the travelling vehicle V1 is in the state permitted to pass), it is assumed to be a state in which the travelling vehicle V2 has transmitted to the controller 4 the passage permission request to enter and pass through the blocking area BA1 in the direction D1.

In the case of the example of FIGS. 7A and 7B, in Step S6, the determiner 31 determines whether or not the forward travelling vehicle (the travelling vehicle V1) of the travelling vehicle V2 having transmitted the passage permission request coincides with the last permitted travelling vehicle (the travelling vehicle V1), and determines that those coincide (YES in Step S6).

When the determiner 31 determines in Step S6 that the forward travelling vehicle of the travelling vehicle V having transmitted the passage permission request does not coincide with the last permitted travelling vehicle (NO in Step S6), the determiner 31 determines not to permit the passage permission request (Step S5), and the passage permission determination is terminated.

When the determiner 31 determines in Step S6 that the forward travelling vehicle of the travelling vehicle V having transmitted the passage permission request coincides with the last permitted travelling vehicle (YES in Step S6), in Step S7, the determiner 31 determines, based on the permission sequence information 35, whether or not the travelling direction of the travelling vehicle V having transmitted the passage permission request with respect to the blocking area BA coincides with the travelling direction of the last permitted travelling vehicle with respect to the blocking area BA. The determiner 31 performs the above determination based on the last permission information LP stored in the first storage.

In Step S7, in the case of the example of FIG. 7A, the determiner 31 determines whether or not the travelling direction (the direction D1) of the travelling vehicle V2 having transmitted the passage permission request coincides with the travelling direction (the direction D1) of the last permitted travelling vehicle (the travelling vehicle V1), and determines that those coincide (YES in Step S7). In the case of the example of FIG. 7B, in Step S7, the determiner 31 determines whether or not the travelling direction (the direction D1) of the travelling vehicle V2 having transmitted the passage permission request coincides with the travelling direction (the direction D2) of the last permitted travelling vehicle (the travelling vehicle V1), and determines that those do not coincide (NO in Step S7).

When the determiner 31 determines in Step S7 that the travelling direction of the travelling vehicle V having transmitted the passage permission request coincides with the travelling direction of the last permitted travelling vehicle (YES in Step S7), the determiner 31 determines to give the permission to pass through the blocking area BA to the travelling vehicle V having transmitted the request for the permission to pass through the blocking area BA (Step S3) and transmits the passage permission (Step S4), and the passage permission determination is terminated. In this case, it is possible to set (possible to control) a state (continuous permission) in which the permission to pass through the blocking area BA1 is able to be given to the travelling vehicles V1, V2 in duplication.

Subsequently, the permission sequence information updater 41 updates the permission sequence information 35 at the timing of transmission of the passage permission by the determiner 31. For example, as illustrated in FIG. 8A, the permission sequence information updater 41 updates (sets) the information on the travelling vehicle V2 to which the passage permission has been given by the determiner 31 as the sequence 1 (the last permitted travelling vehicle), and updates (sets) the permission sequence information 35 by shifting the information (information of the sequence 1) on the already registered travelling vehicle V1 down to a sequence 2.

Figure 8A:
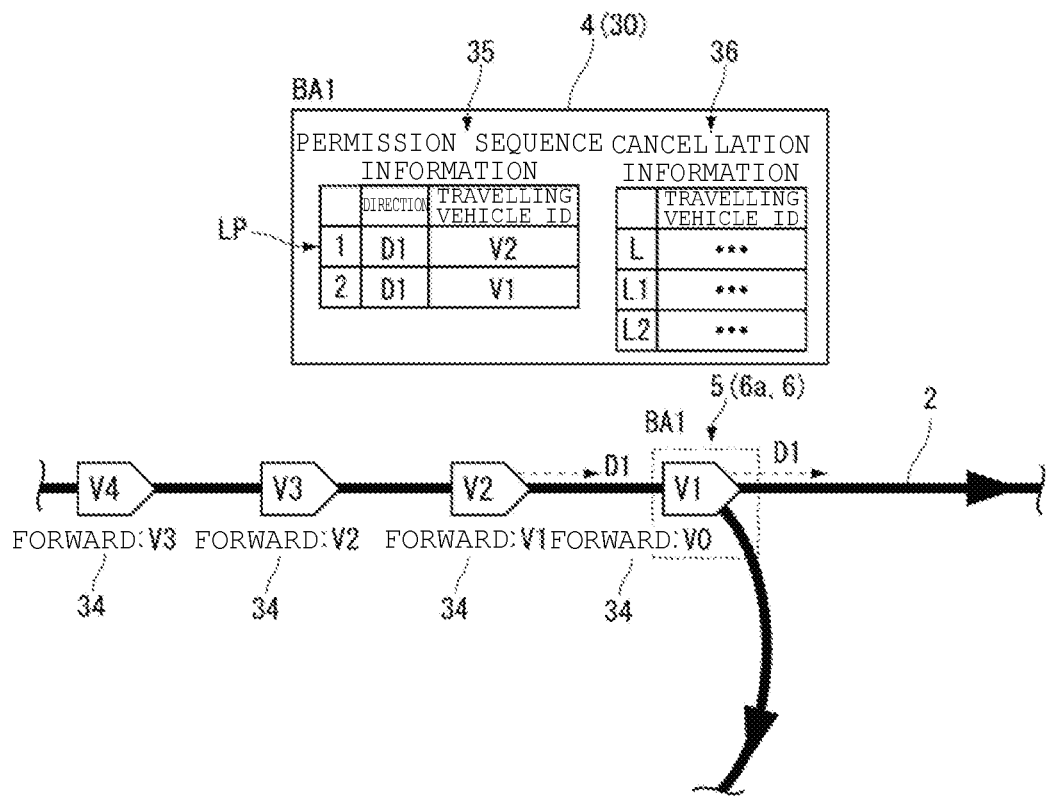
FIGS. 8A and 8B are diagrams for explaining the blocking control of the branching section, following FIG. 7.
Figure 8B:
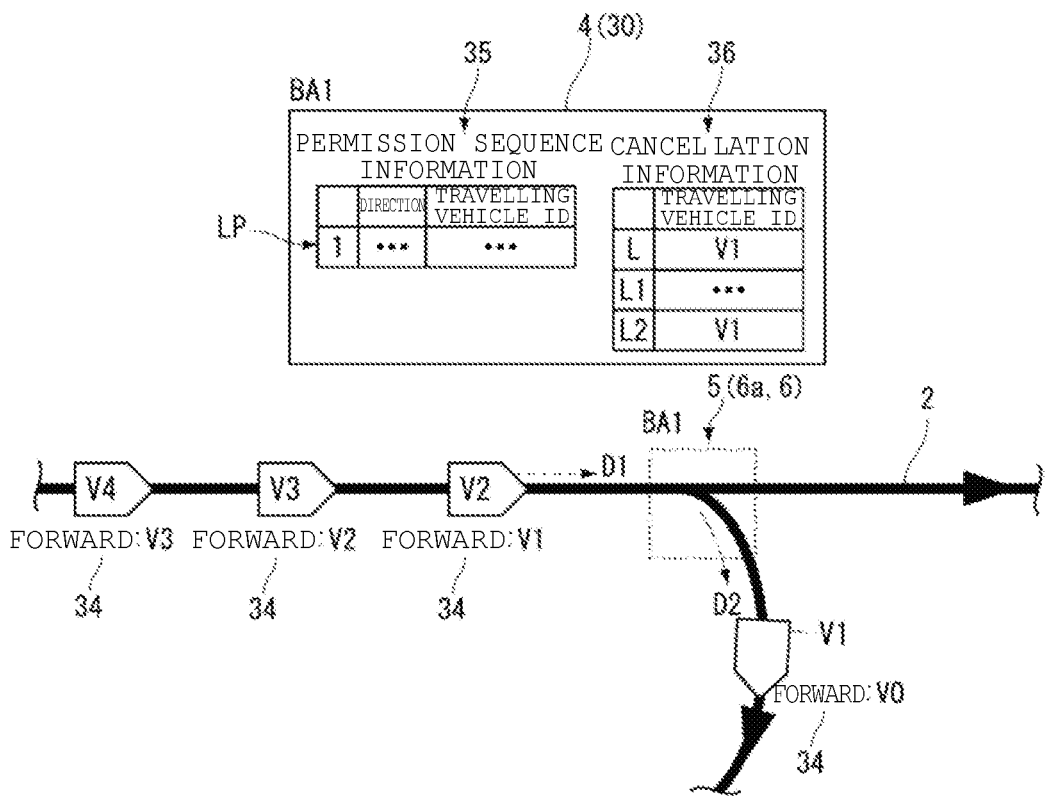

In the state illustrated in FIG. 8A, when the travelling vehicle V3 transmits the passage permission request to enter and pass through the blocking area BA1 in the direction D1, the determiner 31 determines whether or not the forward travelling vehicle (the travelling vehicle V2) of the travelling vehicle V3 having transmitted the passage permission request coincides with the last permitted travelling vehicle (the travelling vehicle V2) (YES in Step S6), and the travelling direction (the direction D1) of the travelling vehicle V3 having transmitted the passage permission request coincides with the direction (the direction D1) in which the last permitted travelling vehicle (the travelling vehicle V2) enters and passes through the blocking area BA1 (YES in Step S7), and the determiner 31 permits the passage permission request. In this state, when the travelling vehicle V4 further transmits the passage permission request to enter and pass through the blocking area BA1 in the direction D1, the determiner 31 performs the same determination as the above-described flow illustrated in FIG. 4 to permit the passage permission request of the travelling vehicle V4. As described above, the travelling vehicle system 1 of the present preferred embodiment is able to perform the above-described continuous permission on two or more travelling vehicles V.

When the determiner 31 determines in Step S7 that the travelling direction of the travelling vehicle V having transmitted the passage permission request does not coincide with the travelling direction of the last permitted travelling vehicle (NO in Step S7), the determiner 31 determines not to permit the passage permission request (Step S5), and the passage permission determination is terminated.

After NO in Step S7 and Step S5 described above, as illustrated in FIG. 8B, the travelling vehicle V1 passes through the blocking area BA1 in the direction D2, and the cancellation information updater 42 registers the travelling vehicle V1 in the last cancellation information L and the direction-specific last cancellation information L2 of the cancellation information 36 as the last canceled travelling vehicle and the direction-specific last canceled travelling vehicle. Thereafter, the request for the permission to pass through the blocking area BA1 is transmitted again from the travelling vehicle V2 to the controller 4. At this time, in Step S1 of FIG. 4, the determiner 31 determines that the travelling vehicle V that is permitted does not exist in the blocking area BA1 (NO in Step S1), and the determiner 31 determines in Step S2 that the forward travelling vehicle (the travelling vehicle V1) of the travelling vehicle V2 having transmitted the passage permission request coincides with the last canceled travelling vehicle (the travelling vehicle V1) (YES in Step S2), and determines in Step S3 to permit the passage permission request. That is, in the travelling vehicle system 1 according to the present preferred embodiment, the determiner 31 may not have the configuration to perform the processing after YES in Step S1 and Step S1 of FIG. 4, and in this configuration, the continuous permission described above cannot be performed.

In the travelling vehicle system 1, the determiner 31 repeatedly determines whether or not to give the passage permission in response to each request for the permission to pass through the blocking area BA of the branching section 6 in each travelling vehicle V as illustrated in FIG. 4, to perform the blocking control of the branching section 6.

As described above, in the travelling vehicle system 1 of the present preferred embodiment, when the blocking area BA has the branching section 6, and when there is the travelling vehicle V which is passing through the blocking area BA and the passage permission for which has not been canceled, the determiner 31 gives the passage permission to the travelling vehicle V having transmitted the request for the permission to pass through the blocking area BA if the forward travelling vehicle of the travelling vehicle V coincides with the last permitted travelling vehicle for the blocking area, and coincides with the last permitted travelling vehicle in the direction in which the last permitted travelling vehicle has passed the branching section 6. In the travelling vehicle system 1 of the present preferred embodiment, when the last permitted travelling vehicle for the blocking area BA is stored in the first storage, if the last permitted travelling vehicle coincides with the forward travelling vehicle of the travelling vehicle waiting for the permission to pass through the blocking area and if the travelling direction of the passage-permission waiting travelling vehicle in the blocking area BA coincides with the travelling direction of the last permitted travelling vehicle, the determiner 31 gives the permission to pass through the blocking area BA to the passage-permission waiting travelling vehicle. When the determiner 31 determines to permit the passage permission request under the above conditions, it is possible to control the travelling vehicle V such that the travelling vehicle V not permitted to pass exists immediately before the travelling vehicle V determined to be given the passage permission, and that the travelling vehicle V permitted to pass and travelling in the same direction as the travelling vehicle V determined to be given the passage permission exists immediately before the travelling vehicle V. Further, when the determiner 31 determines to permit the passage permission request under the above conditions, the above-described continuous permission is able to be performed. As described above, according to the configuration of the travelling vehicle system 1, in the blocking control of the branching section 6, it is possible to achieve control of giving permission to pass through the blocking area BA to a plurality of travelling vehicles V in duplication by simple processing, and as a result, it is possible to perform control so as to allow efficient passage of the plurality of travelling vehicles V through the blocking area BA.

Figure 9:
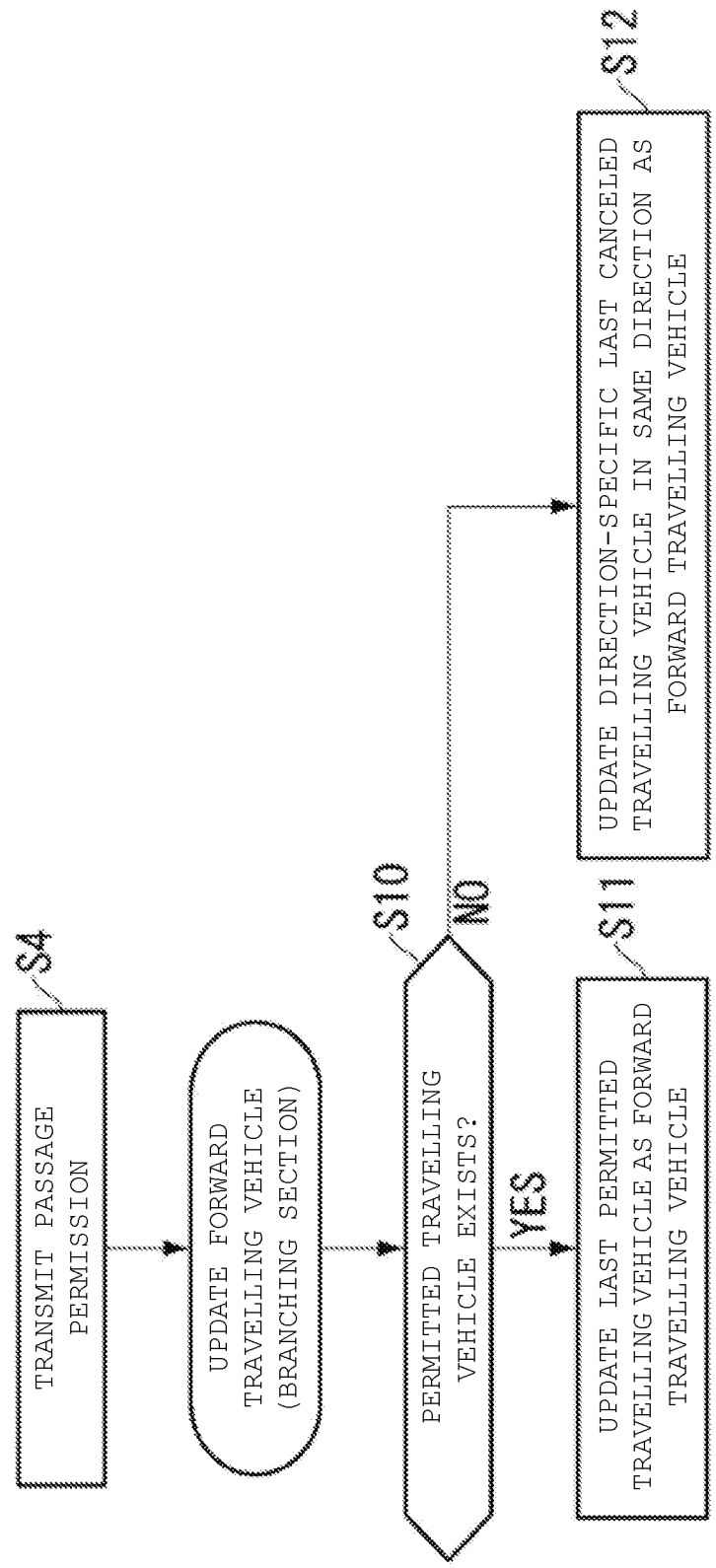
FIG. 9 is a flowchart illustrating the operation of updating forward travelling vehicle information in the blocking control of the branching section.

Next, updating of the forward travelling vehicle information 34 on the blocking control of the branching section 6 will be described. FIG. 9 is a flowchart illustrating an example of updating of the forward travelling vehicle information on the blocking control of the branching section 6. The forward travelling vehicle information updater 40 updates the forward travelling vehicle information on the travelling vehicle V to which the passage permission has been transmitted. At the timing of transmission of the passage permission by the determiner 31 in Step S4 of FIG. 9, the forward travelling vehicle information updater 40 updates the forward travelling vehicle information 34, stored in the storage 30, on the travelling vehicle V to which the passage permission has been transmitted. By the forward travelling vehicle information updater 40 updating the forward travelling vehicle information 34 at the above timing, it is possible to ensure the real time property of the forward travelling vehicle information 34. The forward travelling vehicle information updater 40 updates the forward travelling vehicle information 34 based on the last permission information LP, the last cancellation information L, and the direction-specific last cancellation information L1, L2 of the permission sequence information 35.

In Step S10 of FIG. 9, the forward travelling vehicle information updater 40 determines whether or not the travelling vehicle V permitted to pass exists in the blocking area BA. This determination is the same as the determination in Step S1 of FIG. 4 by the determiner 31 described above. The forward travelling vehicle information updater 40 performs the determination of Step S10 based on the determination result of Step S1 of FIG. 4 by the determiner 31 described above.

When the forward travelling vehicle information updater determines that the travelling vehicle V permitted to pass exists in the blocking area BA in Step S10 (YES in Step S10), in Step S11, the forward travelling vehicle information 34 (the forward travelling vehicle) on the travelling vehicle V to which the passage permission has been transmitted is set and updated to be the last permitted travelling vehicle. That is, as for the forward travelling vehicle of the travelling vehicle V to which the passage permission has been transmitted to pass through the blocking area BA, when there is the travelling vehicle V which is passing through the blocking area BA and the passage permission for which has not been canceled, the forward travelling vehicle information updater 40 updates the last permitted travelling vehicle to be the forward travelling vehicle. Hence, it is possible to reliably perform the control of giving the permission to pass through the blocking area BA to a plurality of travelling vehicles V in duplication. For example, in the case of the example illustrated in FIGS. 7A and 7B, in Step S11, the forward travelling vehicle information updater 40 sets and updates the forward travelling vehicle information 34 (the forward travelling vehicle) on the travelling vehicle V2, to which the passage permission has been transmitted, to be the last permitted travelling vehicle (the travelling vehicle V1).

When the forward travelling vehicle information updater 40 determines in Step S10 that the travelling vehicle V permitted to pass does not exist in the blocking area BA (NO in Step S10), in Step S12, the forward travelling vehicle information 34 (the forward travelling vehicle) on the travelling vehicle V to which the passage permission has been transmitted is set and updated to be the direction-specific last canceled travelling vehicle in the same direction as the direction in which the travelling vehicle V to which the passage permission has been transmitted enters and passes through the branching section 6. That is, as for the forward travelling vehicle of the travelling vehicle V to which the passage permission has been transmitted to pass through the blocking area BA, when the blocking area BA has the branching section 6 and there is no travelling vehicle V passing therethrough, the forward travelling vehicle information updater 40 updates the direction-specific last canceled travelling vehicle, which passes through the branching section 6 in the direction, to be the forward travelling vehicle. It is thus possible to reliably perform the blocking control by simple processing.

For example, in the case of the example of the travelling vehicle V1 (the direction D1) indicated by a solid line in FIG. 6, in Step S12, the forward travelling vehicle information updater 40 updates the forward travelling vehicle information 34 (the forward travelling vehicle) on the travelling vehicle V2 to which the passage permission has been transmitted as the direction-specific last canceled travelling vehicle (the travelling vehicle V1) in the same direction as the direction (the direction D1) in which the travelling vehicle V2 to which the passage permission has been transmitted enters and passes through the blocking area BA1.

For example, in the case of the example of the travelling vehicle V1 (the direction D2) indicated by the two-dot chain line in FIG. 6, in Step S12, the forward travelling vehicle information updater 40 updates the forward travelling vehicle information 34 (the forward travelling vehicle) on the travelling vehicle V2 to which the passage permission has been transmitted, as the last canceled travelling vehicle (not illustrated) in the same direction as the direction (the direction D2) in which the travelling vehicle V2 to which the passage permission has been transmitted enters and passes through the blocking area BA1.

As described above, when the forward travelling vehicle information updater 40 updates the forward travelling vehicle information 34 by the above-described flow illustrated in FIG. 9, the forward travelling vehicle of the travelling vehicle V to which the passage permission has been transmitted is able to be reliably set by simple processing. As a result, the travelling vehicle system 1 is able to reliably perform the blocking control by simple processing.

Next, the blocking control of the merging section 7 will be described.

Figure 10:
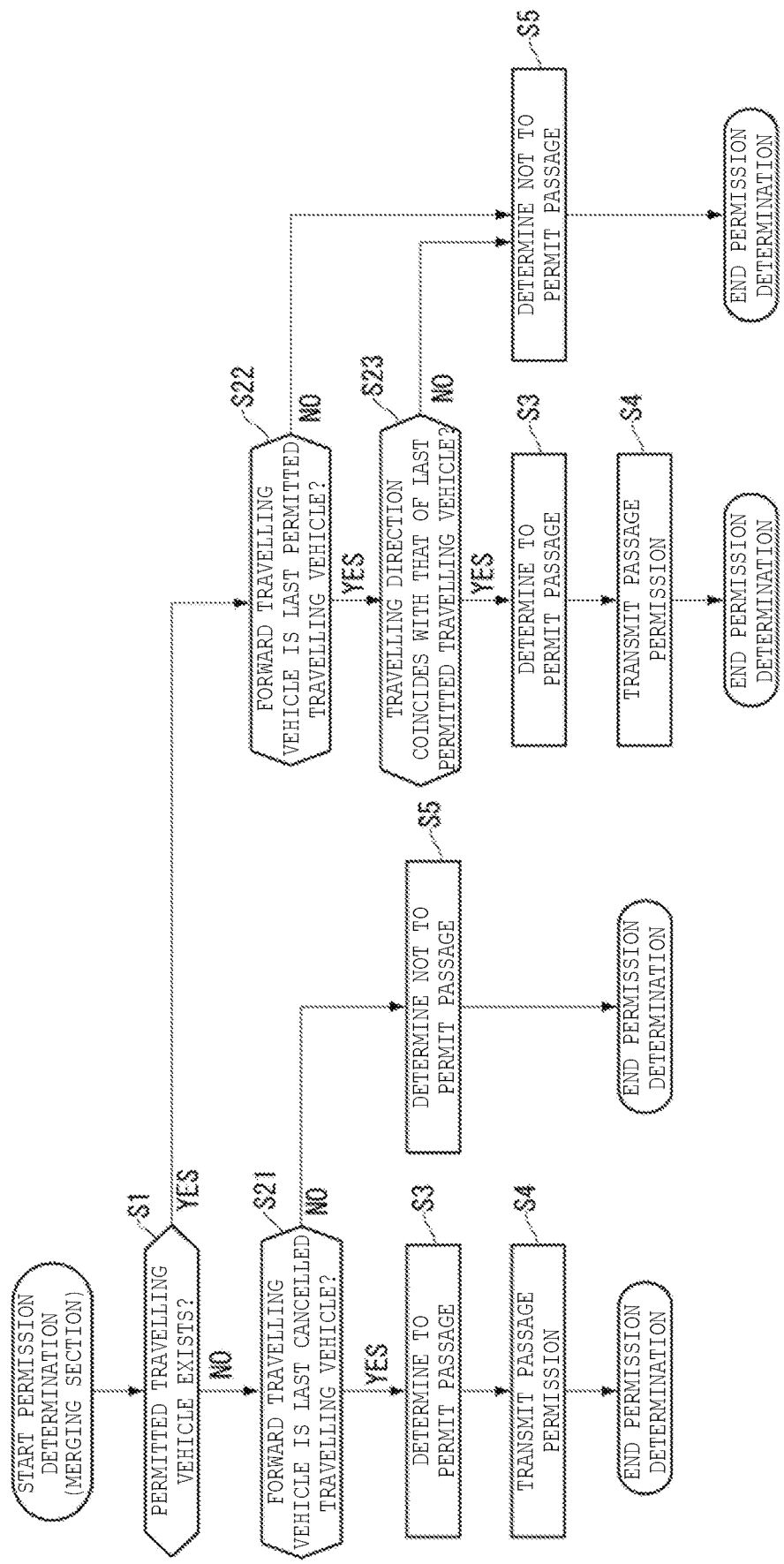
FIG. 10 is a flowchart illustrating the operation of determination on a request for the permission to pass through the blocking area of the merging section.
Figure 11:
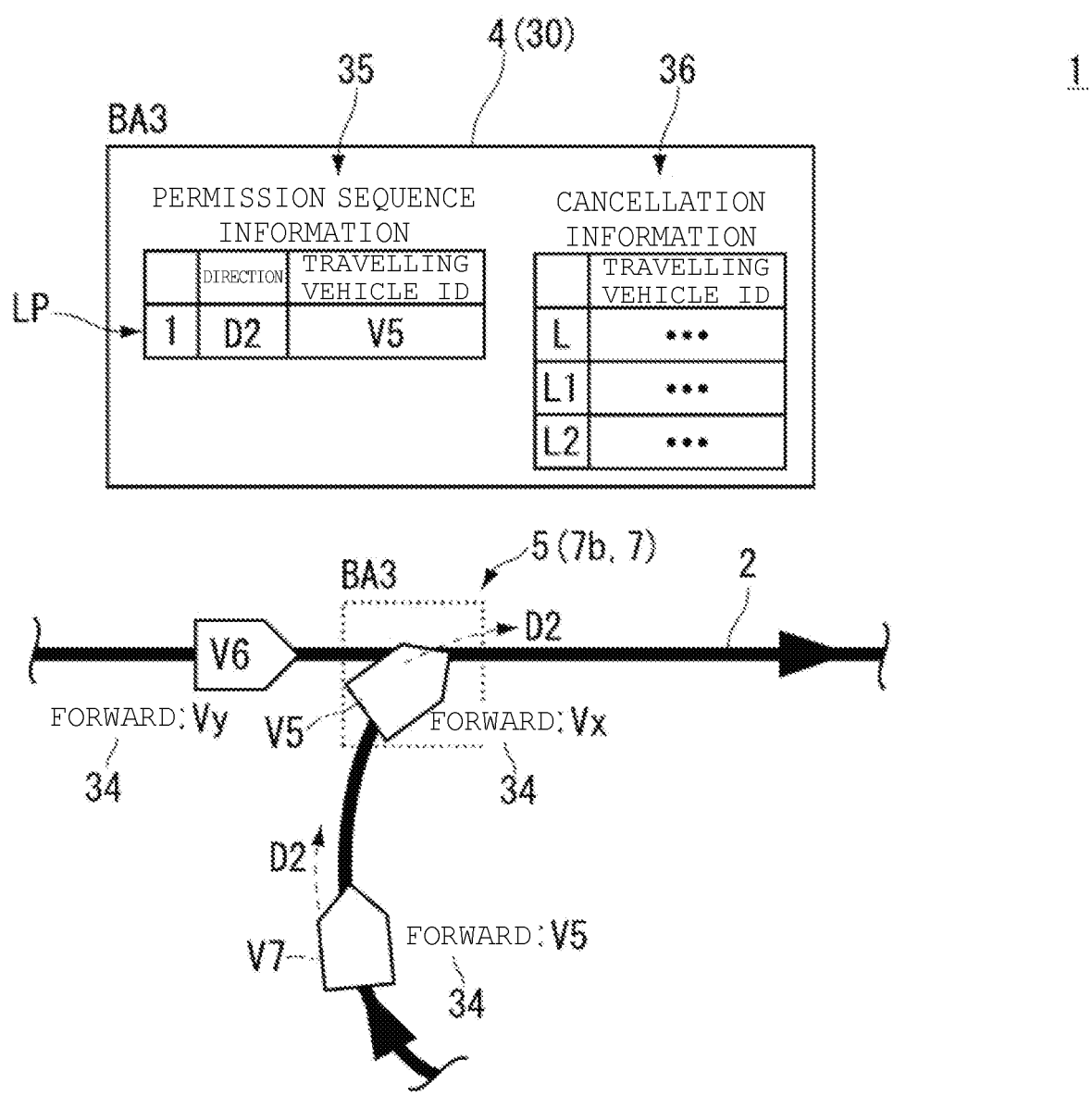
FIG. 11 is a diagram for explaining the blocking control of the merging section.

FIG. 10 is a flowchart illustrating the operation of determination by the determiner 31 on the request of the travelling vehicle V for the permission to pass through the blocking area BA of the merging section 7. FIGS. 11 to 13 are diagrams for explaining the operation of the blocking control of the merging section 7 in the travelling vehicle system 1.

First, the state of the travelling vehicle system 1 illustrated as an example in FIG. 11 and FIGS. 12A and 12B will be described. A travelling vehicle V5 of FIG. 11 is in a state where the passage permission to enter and pass through the blocking area BA3 in the direction D2 has been obtained Behind the travelling vehicle V5, a travelling vehicle V7 is travelling. In addition, a travelling vehicle V6 is travelling at a position in front of the blocking area BA3. It is assumed that the travelling vehicles V5, V6, V7 arrive at the blocking area BA3 in this order. The travelling vehicle V5 is registered in the forward travelling vehicle information 34 of the travelling vehicle V7. In the permission sequence information 35, the travelling vehicle V5 to which the permission to pass through the blocking area BA3 has been given is registered as the last permitted travelling vehicle in the sequence 1.

Figure 12A:
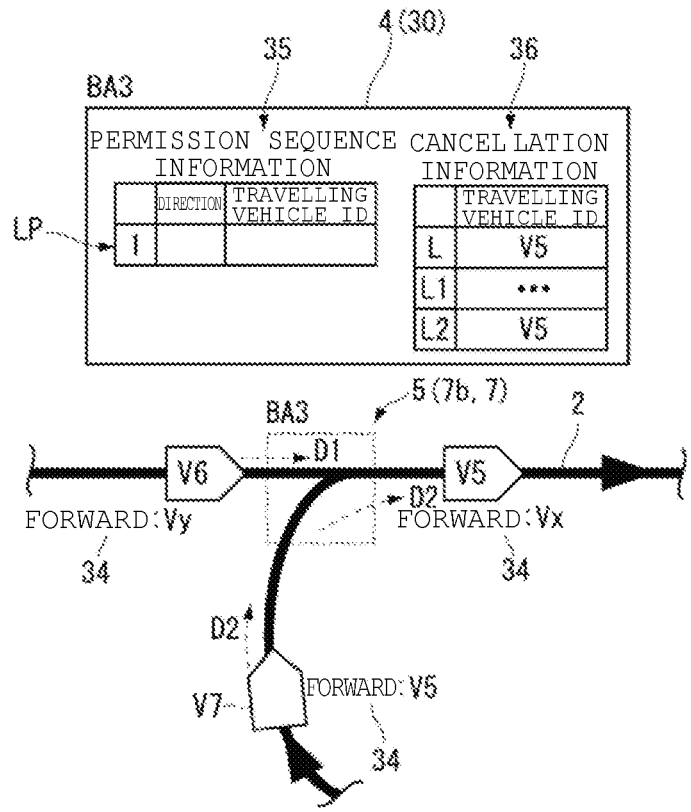
FIGS. 12A and 12B are diagrams for explaining the blocking control of the merging section, following FIG. 11.
Figure 12B:
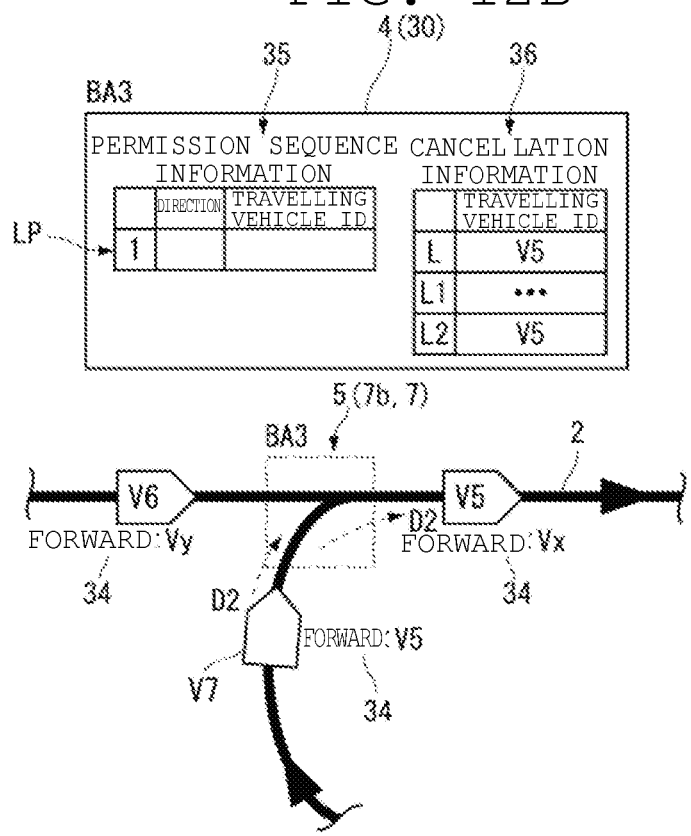

Further, it is assumed that the state of the travelling vehicle system 1 changes from the state illustrated in FIG. 11 to the state illustrated in FIG. 12A or FIG. 12B. In the example of FIGS. 12A and 12B, it is assumed that the travelling vehicle V5 is in the state having entered and passed through the blocking area BA3 in the direction D1. In FIGS. 12A and 12B, it is assumed that at the timing when the travelling vehicle V5 passes through the blocking area BA3, the permission to pass through the blocking area BA3 is canceled, the permission sequence information 35 on the travelling vehicle V5 for which the pass permission has been canceled is deleted, and the information on the travelling vehicle V5 is registered as the last canceled travelling vehicle and the direction-specific last canceled travelling vehicle in the cancellation information 36 In the example of FIG. 12A, the travelling vehicle V6 is in the state having transmitted a passage permission request to enter and pass through the blocking area BA3 in the direction D1. In the example of FIG. 12B, the travelling vehicle V7 transmits a passage permission request that enters and passes through the blocking area BA3 in the direction D2.

In the travelling vehicle system 1 of the present preferred embodiment, as the fundamental principle of the blocking control of the merging section 7, the controller 4 gives the passage permission in the sequence of the travelling vehicle V arriving at the blocking area BA. This is the same as the blocking control of the branching section 6. For example, in the case of the example illustrated in FIG. 11, the controller 4 gives the permission to pass through the blocking area BA3 in the sequence of the travelling vehicles V5, V6, V7. As a result, the travelling vehicle system 1 is able to control the plurality of travelling vehicles V5 to V7 so as to allow efficient passage through the blocking area BA3.

Further, in the travelling vehicle system 1 of the present preferred embodiment, as the principle of the blocking control of the merging section 7, while the permission to pass through the blocking area BA has been given to a certain travelling vehicle V by the controller 4 (until the permission to pass through the blocking area BA is canceled), the permission to pass through the blocking area BA is not given to a travelling vehicle V other than the travelling vehicle V to which the passage permission has been given. This is the same as the blocking control of the branching section 6. For example, in the case of the example illustrated in FIG. 11, the controller 4 does not give the travelling vehicles V6, V7 the permission to pass through the blocking area BA3 while the travelling vehicle V5 has been given the permission to pass through the blocking area BA3. Further, in the travelling vehicle system 1 of the present preferred embodiment, as a principle of the blocking control of the merging section 7, in the blocking area BA, when no passage permission has been given to any travelling vehicle V, the passage permission is given to the travelling vehicle V that will pass the next.

Further, in the travelling vehicle system 1 of the present preferred embodiment, as an exception to the fundamental principle and the principle of the blocking control of the merging section 7, while the permission to pass through the blocking area BA3 has been given to the travelling vehicle V5, even before cancellation of the passage permission, the controller 4 gives the permission to pass through the blocking area BA3 to the travelling vehicle V7 that enters the blocking area BA3 in the same direction as the travelling vehicle V5 to which the passage permission has been given. In this case, the travelling vehicle V7 may be given the permission to pass through the blocking area BA3 before the travelling vehicle V6 that arrives at the blocking area BA3 earlier than the travelling vehicle V7. In this case, the permission to pass through the blocking area BA3 comes into a state where the permission to pass through the blocking area BA3 has been given to the travelling vehicles V5, V7 in duplication (continuous permission). Thus, in the merging section 7 as well, the travelling vehicle system 1 is able to perform control so as to allow the plurality of travelling vehicles V5, V7 to efficiently pass through the blocking area BA3.

An example of the operation related to the fundamental principle, the principle, and the exceptions in the blocking control of the merging section 7 of the travelling vehicle system will be described based on the flowchart of FIG. 10 with reference to FIGS. 11 to 13. Note that the same reference numerals are added to the same configurations as those described above, and the description thereof may be omitted or simplified as appropriate.

In Step S1 of FIG. 10, when the controller 4 receives the request for the permission to pass through the blocking area BA of the merging section 7 from the travelling vehicle V, it is determined whether or not the travelling vehicle V permitted to pass exists in the blocking area BA. For example, in the example of FIGS. 12A and 12B, when the controller 4 receives the request for the permission to pass through the blocking area BA3 from the travelling vehicle V6, the determiner 31 determines, based on the permission sequence information 35, that the travelling vehicle V permitted to pass does not exist in the blocking area BA3 (NO in Step S1).

In Step S1 of FIG. 10, when the determiner 31 determines that the travelling vehicle V permitted to pass does not exist in the blocking area BA (NO in Step S1), in Step S21, the determiner 31 determines whether or not the forward travelling vehicle of the travelling vehicle V having transmitted the passage permission request coincides with the travelling vehicle V that lastly passed through the blocking area BA in the same direction (the direction-specific last canceled travelling vehicle in the same direction) as the travelling vehicle V having transmitted the passage permission request. When the last canceled travelling vehicle that entered the merging section 7 in the same direction as the passage-permission waiting travelling vehicle in the blocking area BA coincides with the forward travelling vehicle of the passage-permission waiting travelling vehicle, the determiner 31 gives the permission to pass through the blocking area to the passage-permission waiting travelling vehicle.

For example, in Step S21, in the case of the example of FIG. 12A, the determiner 31 determines that the forward travelling vehicle (a travelling vehicle Vy (not illustrated)) of the travelling vehicle V6 having transmitted the passage permission request coincides with the direction-specific last canceled travelling vehicle (L1) in the blocking area BA3 in the same direction as the travelling vehicle V6, and determines that those do not coincide (NO in Step S21).

When the determiner 31 determines in Step S21 that the forward travelling vehicle of the travelling vehicle V having transmitted the passage permission request does not coincide with the direction-specific last canceled travelling vehicle in the same direction as the travelling vehicle V (NO in Step S21), the determiner 31 determines not to permit the target passage permission request (Step S5), and the passage permission determination is terminated. In this case, the determination is performed on the passage permission request from the travelling vehicle V7 that will arrive at the target blocking area BA3 next.

For example, in Step S21, in the case of the example of FIG. 12B, the determiner 31 determines whether or not the forward travelling vehicle (the travelling vehicle V5) of the travelling vehicle V7 having transmitted the passage permission request coincides with the direction-specific last canceled travelling vehicle (the travelling vehicle V5, L2) in the blocking area BA3 in the same direction (the direction D2) as the travelling vehicle V7, and determines that those coincide (YES in Step S21).

When the determiner 31 determines in Step S21 that the forward travelling vehicle of the travelling vehicle V having transmitted the passage permission request coincides with the direction-specific last canceled travelling vehicle in the same direction as the travelling vehicle V (YES in Step S21), the determiner 31 determines that the travelling vehicle V having transmitted the request for the permission to pass through the blocking area BA is permitted to pass through the blocking area BA (Step S3) and transmits the passage permission (Step S4), and the passage permission determination is terminated.

Subsequently, the permission sequence information updater 41 updates the permission sequence information at the timing of transmission of the passage permission by the determiner 31. In the case of the example of FIG. 12B, the permission sequence information updater 41 updates the permission sequence information (not illustrated), assuming that the travelling vehicle V7 to which the passage permission has been given is in the sequence 1 (last permitted travelling vehicle).

As described above, in the travelling vehicle system 1 of the present preferred embodiment, when the blocking area BA has the merging section 7, and when there is no travelling vehicle V passing through the blocking area BA, if the forward travelling vehicle of the travelling vehicle V having transmitted the request for the permission to pass through the blocking area BA coincides with the direction-specific last canceled travelling vehicle that enters the merging section 7 in the blocking area BA in the same direction, the determiner 31 gives the passage permission to the travelling vehicle V. In the travelling vehicle system 1 of the present preferred embodiment, when the last permitted travelling vehicle for the blocking area BA including the merging section 7 is not stored in the first storage, if the last canceled travelling vehicle coincides with the forward travelling vehicle of the passage-permission waiting travelling vehicle, the last canceled travelling vehicle having entered the merging section 7 in the same direction as the passage-permission waiting travelling vehicle in the blocking area BA, the determiner gives the permission to pass through the blocking area BA to the passage-permission waiting travelling vehicle. When the determiner 31 determines to permit the passage permission request under the above conditions, it is not determined whether or not the forward travelling vehicle and the last permitted travelling vehicle are the same. When the determiner 31 determines to permit the passage permission request under the above conditions, the travelling vehicle V permitted to pass through the blocking area BA does not exist, and the direction-specific last canceled travelling vehicle coincides, which has passed in the same direction as the direction in which the travelling vehicle V having transmitted the permission to pass through the target blocking area BA travels. Thus, it is possible to control the travelling vehicle V such that no other travelling vehicle V not permitted to pass through the blocking area BA exists between the travelling vehicle V having transmitted the permission request and the target blocking area BA. As a result, the travelling vehicle system 1 is able to control the travelling vehicle V according to the above-described fundamental principle of the blocking control of the branching section 6. As described above, according to the configuration of the travelling vehicle system 1, it is possible to achieve the blocking control of the merging section 7 by simple processing, and it is possible to shorten the time required for processing of the blocking control.

Further, in the travelling vehicle system 1 of the present preferred embodiment, the control related to the continuous permission described above is also performed in the blocking control of the merging section 7.

In Step S1 of FIG. 10, the determiner 31 determines whether or not the travelling vehicle V permitted to pass exists in the blocking area BA.

Figure 13A:
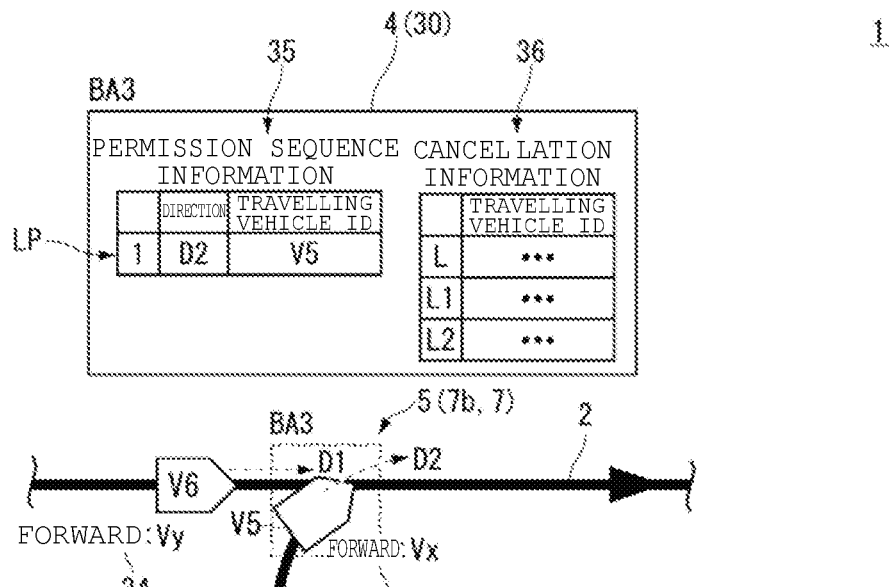
FIGS. 13A and 13B are diagrams for explaining the blocking control of the merging section, following FIG. 12.

Here, in the example illustrated in FIG. 13A, when the travelling vehicle V5 obtains the passage permission to enter and pass through the blocking area BA3 in the direction D2 and is not passing through the blocking area BA3, it is assumed to be a state in which the travelling vehicle V6 has transmitted to the controller 4 the passage permission request to enter and pass through the blocking area BA3 in the direction D1.

Figure 13B:
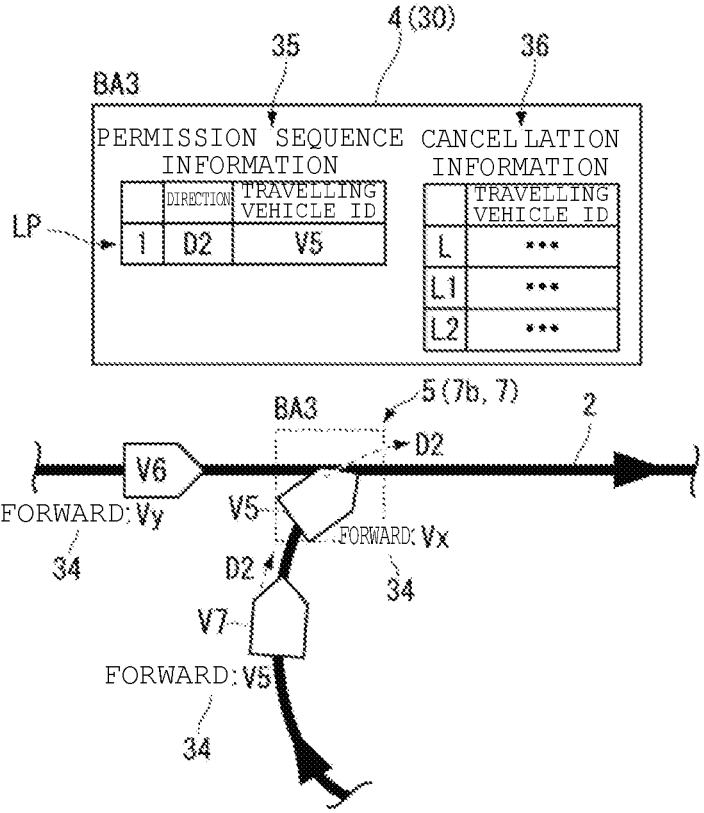

In the example illustrated in FIG. 13B, when the travelling vehicle V5 obtains the passage permission to enter and pass through the blocking area BA3 in the direction D2 and the travelling vehicle V5 is not passing through the blocking area BA3, it is assumed to be a state in which the travelling vehicle V7 has transmitted to the controller 4 the passage permission request to enter and pass through the blocking area BA3 in the direction D2.

In Step S1 of FIG. 10, in the case of the example illustrated in FIGS. 13A and 13B, the determiner 31 determines that the travelling vehicle V5 permitted to pass exists in the blocking area BA3 (YES in Step S1).

When the determiner 31 determines in Step S1 that the travelling vehicle V permitted to pass exists in the blocking area BA (YES in Step S1), in Step S22, the determiner 31 determines, based on the permission sequence information 35, whether or not the forward travelling vehicle of the travelling vehicle V having transmitted the passage permission request coincides with the last permitted travelling vehicle. The determiner 31 performs the above determination based on the last permission information LP stored in the first storage. Step S22 is the same as Step S6 of FIG. 4.

For example, in Step S22, in the case of the example illustrated in FIG. 13A, the determiner 31 determines that the forward travelling vehicle (the travelling vehicle Vy (not illustrated)) of the travelling vehicle V6 having transmitted the passage permission request does not coincide with the last permitted travelling vehicle (the travelling vehicle V5) (NO in Step S22).

For example, in the case of the example illustrated in FIG. 13B, in Step S22, the determiner 31 determines that the forward travelling vehicle (the travelling vehicle V5) of the travelling vehicle V7 having transmitted the passage permission request coincides with the last permitted travelling vehicle (the travelling vehicle V5) (YES in Step S22).

When the determiner 31 determines in Step S22 that the forward travelling vehicle of the travelling vehicle V having transmitted the passage permission request coincides with the last permitted travelling vehicle (YES in Step S22), in Step S23, the determiner 31 determines whether or not the travelling direction of the travelling vehicle V having transmitted the passage permission request coincides with the travelling direction of the last permitted travelling vehicle. The determiner 31 performs the above determination based on the last permission information LP stored in the first storage. Step S23 is the same as Step S7 of FIG. 4.

For example, in Step S23, in the case of the example illustrated in FIG. 13B, the determiner 31 determines whether or not the travelling direction (the direction D2) of the travelling vehicle V7 having transmitted the passage permission request coincides with the travelling direction (the direction D2) of the last permitted travelling vehicle (YES in Step S23).

When the determiner 31 determines in Step S23 that the travelling direction of the travelling vehicle V having transmitted the passage permission request coincides with the travelling direction of the last permitted travelling vehicle (YES in Step S23), the determiner 31 determines to permit the received passage permission request (Step S3) and transmits the passage permission (Step S4), and the passage permission determination is terminated. For example, in the example of FIG. 13B, the determiner 31 determines to permit the passage permission request of the travelling vehicle V7 and transmits the passage permission to the travelling vehicle V7, and the passage permission determination is terminated. In this case, it is possible to set a state in which the permission to pass through the blocking area BA3 is able to be given to the travelling vehicles V5, V7 in duplication (continuous permission). Hence, the travelling vehicle system 1 is able to perform control so as to allow the plurality of travelling vehicles V5, V7 to efficiently pass through the blocking area BA3.

As described above, in the travelling vehicle system 1 of the present preferred embodiment, when the blocking area BA has the merging section 7, and when there is the travelling vehicle V which is passing through the blocking area BA and the passage permission for which has not been canceled, the determiner 31 gives the passage permission to the travelling vehicle V having transmitted the request for the permission to pass through the blocking area BA if the forward travelling vehicle of the travelling vehicle V coincides with the last permitted travelling vehicle for the blocking area BA, and coincides with the last permitted travelling vehicle in the direction in which the last permitted travelling vehicle passes the merging section 7. In the travelling vehicle system 1 of the present preferred embodiment, when the last permitted travelling vehicle for the blocking area BA is stored in the first storage, if the last permitted travelling vehicle coincides with the forward travelling vehicle of the travelling vehicle waiting for the permission to pass through the blocking area BA and if the travelling direction of the passage-permission waiting travelling vehicle in the blocking area BA coincides with the travelling direction of the last permitted travelling vehicle, the determiner 31 gives the permission to pass through the blocking area BA to the passage-permission waiting travelling vehicle. The conditions for determining whether or not to transmit the passage permission are the same as the case of the blocking area BA of the branching section 6 described above. When the determiner 31 determines to permit the passage permission request under the above conditions, it is possible to control the travelling vehicle V such that the travelling vehicle V not permitted to pass exists immediately before the travelling vehicle V determined to be given the passage permission, and that the travelling vehicle V permitted to pass and travelling in the same direction as the travelling vehicle V determined to be given the passage permission exists immediately before the travelling vehicle V. Further, when the determiner 31 determines to permit the passage permission request under the above conditions, the above-described continuous permission is able to be performed. As described above, according to the configuration of the travelling vehicle system 1, in the blocking control of the branching section 6 and the merging section 7, it is possible to achieve control of giving permission to pass through the blocking area BA to a plurality of travelling vehicles V in duplication by simple processing, and as a result, it is possible to perform control so as to allow efficient passage of the plurality of travelling vehicles V through the blocking area. In the blocking control of the merging section 7, the travelling vehicle system 1 is also able to perform the above-described continuous permission for two or more travelling vehicles V similarly to the blocking control of the branching section 6 described above.

Figure 14:
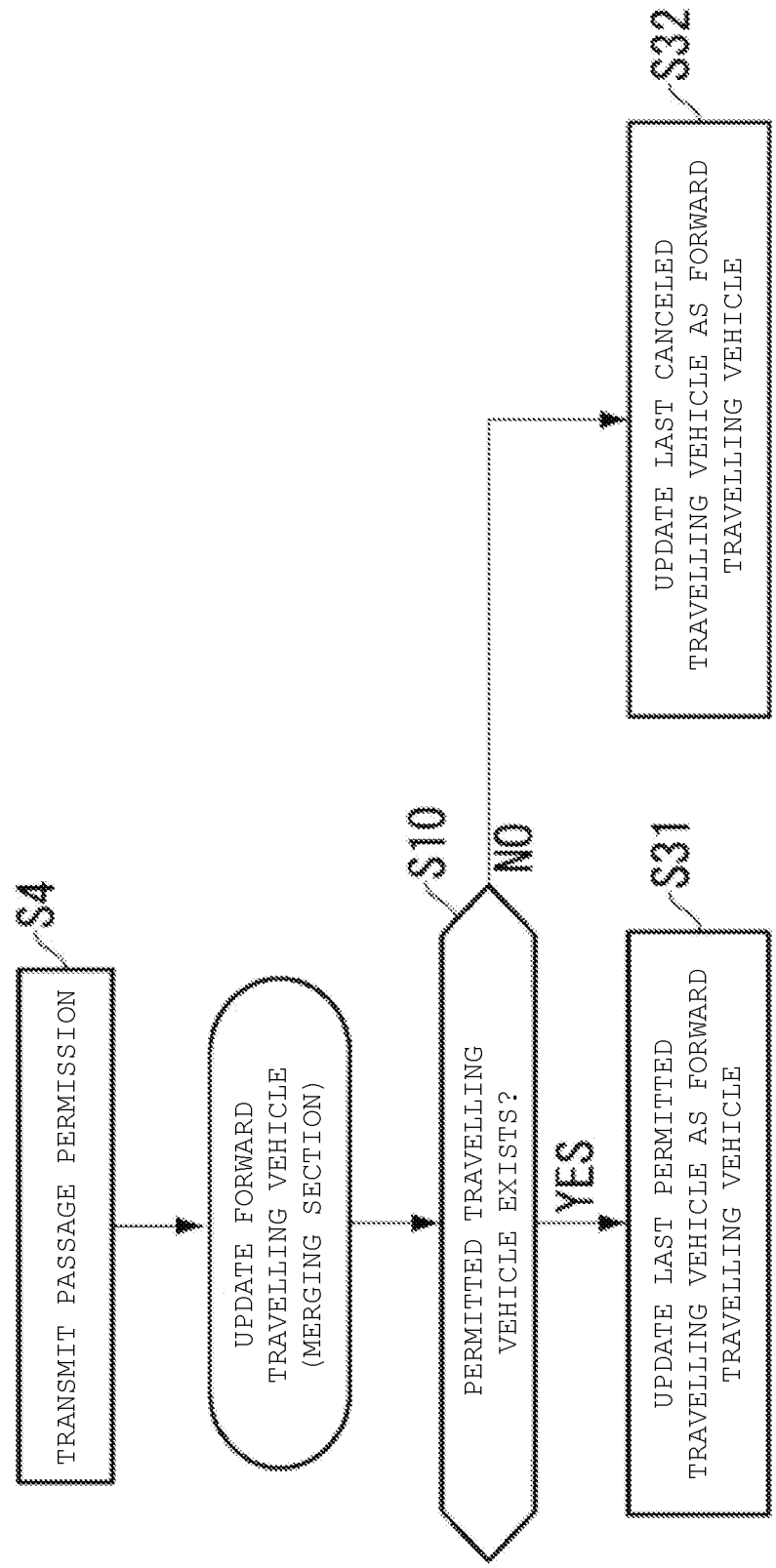
FIG. 14 is a flowchart illustrating the operation of updating forward travelling vehicle information in the blocking control of the merging section.

Next, updating of the forward travelling vehicle information 34 on the blocking control of the merging section 7 will be described. FIG. 14 is a flowchart illustrating an example of updating of the forward travelling vehicle information on the blocking control of the merging section 7. At the timing of transmission of the passage permission by the determiner 31 in Step S4 of FIG. 14, the forward travelling vehicle information updater 40 updates the forward travelling vehicle information 34 on the travelling vehicle V to which the passage permission has been transmitted. By the forward travelling vehicle information updater 40 updating the forward travelling vehicle information 34 at the above timing, it is possible to ensure the real time property of the forward travelling vehicle information 34.

In Step S10 of FIG. 14, the forward travelling vehicle information updater 40 determines whether or not the travelling vehicle V permitted to pass exists in the blocking area BA. Step S10 of FIG. 14 is the same as Step S10 of FIG. 9.

When the forward travelling vehicle information updater determines that the travelling vehicle V permitted to pass exists in the blocking area BA in Step S10 (YES in Step S10), in Step S31, the forward travelling vehicle information 34 (the forward travelling vehicle) on the travelling vehicle V to which the passage permission has been transmitted is set and updated to be the last permitted travelling vehicle. That is, as for the forward travelling vehicle of the travelling vehicle V to which the passage permission has been transmitted to pass through the blocking area BA, when there is the travelling vehicle V which is passing through the blocking area BA and the passage permission for which has not been canceled, the forward travelling vehicle information updater 40 updates the last permitted travelling vehicle to be the forward travelling vehicle. Hence, it is possible to reliably perform the control of giving the permission to pass through the blocking area BA to a plurality of travelling vehicles V in duplication.

For example, in the case of the example illustrated in FIG. 13B, in Step S31, the forward travelling vehicle information updater 40 sets and updates the forward travelling vehicle information 34 (the forward travelling vehicle) on the travelling vehicle V7, to which the passage permission has been transmitted, to be the last permitted travelling vehicle (the travelling vehicle V5).

When the forward travelling vehicle information updater 40 determines in Step S10 that the travelling vehicle V other than the travelling vehicle V having transmitted the request for the permission to pass through the blocking area BA has obtained the passage permission and no travelling vehicle V before cancellation of the passage permission exists (NO in Step S10), in Step S32, the forward travelling vehicle information 34 on the travelling vehicle V (forward travelling vehicle) having transmitted the passage permission is set and updated to be the last canceled travelling vehicle having passed through the target blocking area BA. That is, as for the forward travelling vehicle of the travelling vehicle that transmitted the permission to pass through the blocking area BA, when the blocking area BA has the merging section 7 and there is no travelling vehicle V passing through, the forward travelling vehicle information updater 40 updates the last canceled travelling vehicle to the forward travelling vehicle. Thus, it is possible to reliably perform the blocking control by simple processing.

For example, in the case of the example illustrated in FIG. 12B, in Step S32, the forward travelling vehicle information updater 40 sets and updates the forward travelling vehicle information 34 (the forward travelling vehicle) on the travelling vehicle V7, to which the passage permission has been transmitted, to be the last cancelled travelling vehicle (the travelling vehicle V5) having passed the target blocking area BA.

As described above, when the forward travelling vehicle information updater 40 updates the forward travelling vehicle information 34 by the above-described flow illustrated in FIG. 14, the forward travelling vehicle of the travelling vehicle V to which the passage permission has been transmitted is able to be reliably set by simple processing. As a result, the travelling vehicle system 1 is able to reliably perform the blocking control by simple processing.

As described above, the travelling vehicle system 1 of the present preferred embodiment is a travelling vehicle system including the controller 4; and a plurality of travelling vehicles V, each of which travels along the track 2 partially including the blocking area BA including the branching section 6 or the merging section 7, transmits a request for the permission to pass through the blocking area BA to the controller 4, and passes through the blocking area BA when receiving the passage permission from the controller, while stopping in front of the blocking area BA when receiving no passage permission, the controller 4 canceling the passage permission for the travelling vehicle V, to which the controller 4 transmits the passage permission, after passage of the travelling vehicle V through the blocking area BA. The controller 4 includes the first storage that stores the last permitted travelling vehicle, to which the passage permission is transmitted lastly and the passage permission for which is not canceled, for each direction in the branching section 6 or the merging section 7 included in the blocking area BA, the second storage that stores the last canceled travelling vehicle, the passage permission for which is canceled lastly, for each direction in the branching section 6 or the merging section 7 included in the blocking area BA, the third storage that stores the travelling vehicle V, to which the passage permission in the same direction in the blocking area BA is transmitted lastly, as the forward travelling vehicle of the travelling vehicle waiting for the permission to pass through the blocking area BA at the time of transmission of the passage permission to the passage-permission waiting travelling vehicle, and the determiner 31 that determines whether to give the passage permission to the travelling vehicle waiting for the permission to pass through the blocking area BA based on whether the forward travelling vehicle of the passage-permission waiting travelling vehicle coincides with the last permitted travelling vehicle or the last canceled travelling vehicle for the blocking area BA. For example, the travelling vehicle system 1 is a travelling vehicle system including the controller 4; and a plurality of travelling vehicles V, each of which travels along the track 2 partially including the blocking area BA including the branching section 6 or the merging section 7, transmits a request for the permission to pass through the blocking area BA to the controller 4, and passes through the blocking area BA when receiving the passage permission in response to the passage permission request from the controller, while stopping in front of the blocking area BA when receiving no passage permission, the controller 4 canceling the passage permission for the travelling vehicle V, to which the controller 4 transmits the passage permission, after passage of the travelling vehicle V through the blocking area BA. The controller 4 is configured or programmed to include the storage 30 that stores the last permission information LP on the last permitted travelling vehicle to which the passage permission was given lastly in the blocking area BA, the last cancellation information L on the last canceled travelling vehicle which lastly passed through the blocking area BA and the passage permission for which has been canceled, and the direction-specific last cancellation information L1, L2 on the direction-specific last canceled travelling vehicle which lastly passed through the branching section 6 or the merging section 7 in a predetermined direction; and the determiner 31 that reads, when the passage permission request is received from the travelling vehicle V, the forward travelling vehicle information 34 of the travelling vehicle V and any of the last permission information, the last cancellation information, and the direction-specific last cancellation information for the blocking area BA through which the travelling vehicle V is going to pass, from the storage 30, and determines whether or not to give the passage permission to the travelling vehicle V based on whether or not the forward travelling vehicle of the travelling vehicle V coincides with any of the last permitted travelling vehicle, the last canceled travelling vehicle, and the direction-specific last canceled travelling vehicle for the blocking area BA.

In the travelling vehicle system 1 of the present preferred embodiment, configurations other than the configuration described above are freely selectable configurations, and the configurations other than those described above may or may not be formed. As described above, in the travelling vehicle system 1 of the present preferred embodiment, it is determined whether or not to give the passage permission to the passage-permission waiting travelling vehicle based on whether the forward travelling vehicle of the travelling vehicle waiting for the permission to pass through the blocking area BA coincides with the last permitted travelling vehicle or the last canceled travelling vehicle for the blocking area BA, so that it is not necessary to use processing that takes time such as searching for the travelling route of the travelling vehicle V as described above, and it is possible to shorten the time required for the processing from the reception of the request from the travelling vehicle V to pass through the blocking area BA to the completion of the passage permission determination. As a result, the travelling vehicle system 1 reliably ensures the real time property of the blocking control. The controller 4 of the travelling vehicle system 1 is able to be distributed independently of the travelling vehicle system 1. For example, in the existing travelling vehicle system, the travelling vehicle system 1 and the controller 4 is able to be implemented by changing only the controller without changing the host controller, thus enabling simple and low-cost introduction.

Next, a non-limiting example of a method for controlling the travelling vehicle according to a preferred embodiment of the present invention will be described. The example method for controlling the travelling vehicle according to the present preferred embodiment is a method for controlling the travelling vehicle V in the travelling vehicle system 1 including the controller 4; and a plurality of travelling vehicles V, each of which travels along the track 2 partially including the blocking area BA including the branching section 6 or the merging section 7, transmits a request for the permission to pass through the blocking area BA to the controller 4, and passes through the blocking area BA when receiving the passage permission in response to the passage permission request from the controller 4, while stopping in front of the blocking area BA when receiving no passage permission, the controller 4 canceling the passage permission for the travelling vehicle, to which the controller 4 transmits the passage permission, after passage of the travelling vehicle V through the blocking area BA. The method for controlling the travelling vehicle according to the present preferred embodiment includes processing in which the controller 4 stores the last permitted travelling vehicle, to which the passage permission is transmitted lastly and the passage permission for which is not canceled, for each direction in the branching section 6 or the merging section 7 included in the blocking area BA, stores the last canceled travelling vehicle, the passage permission for which is canceled lastly, for each direction in the branching section 6 or the merging section 7 included in the blocking area BA, stores the travelling vehicle V, to which the passage permission in the same direction in the blocking area BA is transmitted lastly, as the forward travelling vehicle of the travelling vehicle V waiting for the permission to pass through the blocking area BA at the time of transmission of the passage permission to the passage-permission waiting travelling vehicle, and determines whether or not to give the passage permission to the travelling vehicle waiting for the permission to pass through the blocking area BA based on whether the forward travelling vehicle of the passage-permission waiting travelling vehicle coincides with the last permitted travelling vehicle or the last canceled travelling vehicle for the blocking area BA. The method for controlling the travelling vehicle according to the present preferred embodiment is able to be carried out, for example, by the travelling vehicle system 1 described above. The method for controlling the travelling vehicle according to the present preferred embodiment is not limited to the above configuration, and may include the configuration described above for the travelling vehicle system 1. Further, the control method of the present preferred embodiment may be supplied by a program or programs that cause(s) the computer device to execute the above control method, or a storage medium that stores (records) the program or programs.

As described above, the travelling vehicle systems and the methods for controlling the travelling vehicle according to the present preferred embodiments do not need to use time-consuming processing such as searching for a travelling route of the travelling vehicle as described above, and the passage permission determination is able to be performed by simple processing such as reading the forward travelling vehicle of the travelling vehicle waiting for the permission to pass through the blocking area BA and the last permitted travelling vehicle or the last canceled travelling vehicle for the blocking area BA, and determining whether or not those travelling vehicles coincide with each other, so that it is possible to shorten the time required for the processing from the reception, by the controller 4, of the request from the travelling vehicle V for the permission to pass through the blocking area BA to the completion of the passage permission determination, and reliably ensure the real time property of the blocking control. In addition, in the travelling vehicle systems and the methods for controlling the travelling vehicle according to preferred embodiments of the present invention, by utilizing the rule that the arrangement sequence of a plurality of travelling vehicles V does not change between the two blocking areas BA, it is possible to obtain the sequence of the travelling vehicles entering the blocking area BA by simple processing based on the information of the forward travelling vehicle travelling in front of each travelling vehicle V. Further, in the configuration for determining the sequence of the travelling vehicles V entering the blocking area BA by using the forward travelling vehicle information 34 as in the travelling vehicle system 1 of the present preferred embodiment, even when the sequence of the positions of the travelling vehicles V is reversed due to deterioration in communication state between the controller 4 and the travelling vehicle V, it is possible to manage the sequence of the travelling vehicles V entering the blocking area BA without error.

Although the preferred embodiments of the present invention have been described above, the technical scope of the present invention is not limited to the above-described preferred embodiments. It will be apparent to those skilled in the art that various modifications or improvements can be made to the preferred embodiments described above. Also, a mode including such modifications or improvements is also included in the technical scope of the present invention.

One or more of the requirements, elements, features, characteristics, etc. described with respect to the above preferred embodiments and the like may be omitted. Further, the requirements, elements, features, characteristics, etc. described with respect to the above preferred embodiments and the like can be combined as appropriate. Moreover, insofar as is permitted by law, part of the present specification is described with the aid of disclosures of all publications cited in the above preferred embodiments and the like. Furthermore, the execution sequence of each processing illustrated in the present preferred embodiments can be realized in any sequence as long as the output of the previous processing is not used in the subsequent processing. In addition, regarding the operation in the above-described preferred embodiments, even when it is described using "first", "next", "successive" or the like for convenience, it is not indispensable to perform in this order.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A travelling vehicle system comprising:
   a controller; and
   a plurality of travelling vehicles, each of which travels along a track partially including a blocking area including a branching section, transmits a request for permission to pass through the blocking area to the controller, and passes through the blocking area when receiving passage permission from the controller, and stopping in front of the blocking area when receiving no passage permission, the controller canceling the passage permission for the travelling vehicle, to which the controller transmits the passage permission, after passage of the travelling vehicle through the blocking area; wherein
   the controller is configured or programmed to include:
      a first storage that stores a last permitted travelling vehicle, to which the passage permission is transmitted lastly and the passage permission for which is not canceled, for each direction in the branching section included in the blocking area;
      a second storage that stores a last canceled travelling vehicle, the passage permission for which is canceled lastly, for each direction in the branching section included in the blocking area;
      a third storage that stores the travelling vehicle, to which the passage permission in a same direction in the blocking area is transmitted lastly, as a forward travelling vehicle of a travelling vehicle waiting for the permission to pass through the blocking area at the time of transmission of the passage permission to the passage-permission waiting travelling vehicle; and
      a determiner that determines whether to give passage permission to the travelling vehicle waiting for the permission to pass through the blocking area based on whether the forward travelling vehicle of the passage-permission waiting travelling vehicle coincides with the last permitted travelling vehicle or the last canceled travelling vehicle for the blocking area; and
   when the last permitted travelling vehicle for the blocking area including the branching section is not stored in the first storage, if the last canceled travelling vehicle for the blocking area coincides with the forward travelling vehicle of the travelling vehicle waiting for the permission to pass through the blocking area, the determiner gives permission to pass through the blocking area to the passage-permission waiting travelling vehicle.

2. The travelling vehicle system according to claim 1, wherein, when the last permitted travelling vehicle for the blocking area is stored in the first storage, if the last permitted travelling vehicle coincides with the forward travelling vehicle of the travelling vehicle waiting for the permission to pass through the blocking area and if a travelling direction of the passage-permission waiting travelling vehicle in the branching section included in the blocking area coincides with a direction of the last permitted travelling vehicle, the determiner gives permission to pass through the blocking area to the passage-permission waiting travelling vehicle.

3. A travelling vehicle system comprising:
   a controller; and
   a plurality of travelling vehicles, each of which travels along a track partially including a blocking area including a merging section, transmits a request for permission to pass through the blocking area to the controller, and passes through the blocking area when receiving passage permission from the controller, and stopping in front of the blocking area when receiving no passage permission, the controller canceling the passage permission for the travelling vehicle, to which the controller transmits the passage permission, after passage of the travelling vehicle through the blocking area;
   wherein
   the controller is configured or programmed to include:
      a first storage that stores a last permitted travelling vehicle, to which the passage permission is transmitted lastly and the passage permission for which is not canceled, for each direction in the merging section included in the blocking area;
      a second storage that stores a last canceled travelling vehicle, the passage permission for which is canceled lastly, for each direction in the merging section included in the blocking area;
      a third storage that stores the travelling vehicle, to which the passage permission in a same direction in the blocking area is transmitted lastly, as a forward travelling vehicle of a travelling vehicle waiting for the permission to pass through the blocking area at the time of transmission of the passage permission to the passage-permission waiting travelling vehicle; and
      a determiner that determines whether to give passage permission to the travelling vehicle waiting for the permission to pass through the blocking area based on whether the forward travelling vehicle of the passage-permission waiting travelling vehicle coincides with the last permitted travelling vehicle or the last canceled travelling vehicle for the blocking area; and when the last permitted travelling vehicle for the blocking area including the merging section is not stored in the first storage, if the last canceled travelling vehicle coincides with the forward travelling vehicle of the passage-permission waiting travelling vehicle, the last canceled travelling vehicle having entered the merging section in the same direction as the passage-permission waiting travelling vehicle in the blocking area, the determiner gives permission to pass through the blocking area to the passage-permission waiting travelling vehicle.

4. A method for controlling a travelling vehicle in a travelling vehicle system including a controller, and a plurality of travelling vehicles, each of which travels along a track partially including a blocking area including a branching section, transmits a request for permission to pass through the blocking area to the controller, and passes through the blocking area when receiving passage permission from the controller, and stopping in front of the blocking area when receiving no passage permission, the controller canceling the passage permission for the travelling vehicle, to which the controller transmits the passage permission, after passage of the travelling vehicle through the blocking area, the method comprising:
   storing a last permitted travelling vehicle, to which the passage permission is transmitted lastly and the passage permission for which is not canceled, for each direction in the branching section included in the blocking area;
   storing a last canceled travelling vehicle, the passage permission for which is canceled lastly, for each direction in the branching section included in the blocking area;
   storing the travelling vehicle, to which the passage permission in a same direction in the blocking area is transmitted lastly, as a forward travelling vehicle of a travelling vehicle waiting for the permission to pass through the blocking area at the time of transmission of the passage permission to the passage-permission waiting travelling vehicle;
   determining whether to give passage permission to the travelling vehicle waiting for the permission to pass through the blocking area based on whether the forward travelling vehicle of the passage-permission waiting travelling vehicle coincides with the last permitted travelling vehicle or the last canceled travelling vehicle for the blocking area; and
   when the last permitted travelling vehicle for the blocking area including the branching section is not stored, if the last canceled travelling vehicle for the blocking area coincides with the forward travelling vehicle of the travelling vehicle waiting for the permission to pass through the blocking area, giving permission to pass through the blocking area to the passage-permission waiting travelling vehicle.

* * * * *